United States Patent
Rotzoll et al.

(10) Patent No.: US 9,997,102 B2
(45) Date of Patent: Jun. 12, 2018

(54) WIRELESSLY POWERED DISPLAY AND SYSTEM

(71) Applicant: X-Celeprint Limited, Cork (IE)

(72) Inventors: Robert R. Rotzoll, Colorado Springs, CO (US); Christopher Andrew Bower, Raleigh, NC (US); Ronald S. Cok, Rochester, NY (US)

(73) Assignee: X-Celeprint Limited, Cork (IE)

( * ) Notice: Subject to any disclaimer, the term of this patent is extended or adjusted under 35 U.S.C. 154(b) by 0 days. days.

(21) Appl. No.: 15/452,183

(22) Filed: Mar. 7, 2017

(65) Prior Publication Data

US 2017/0301282 A1    Oct. 19, 2017

Related U.S. Application Data

(63) Continuation-in-part of application No. 15/157,838, filed on May 18, 2016.
(Continued)

(51) Int. Cl.
*G08B 25/10* (2006.01)
*G09G 3/32* (2016.01)
(Continued)

(52) U.S. Cl.
CPC ............ *G09G 3/32* (2013.01); *G06K 19/071* (2013.01); *G06K 19/0723* (2013.01);
(Continued)

(58) Field of Classification Search
CPC .. B42D 25/29; B42D 25/485; B42D 2033/46; G07D 7/0093; G07D 7/00;
(Continued)

(56) References Cited

U.S. PATENT DOCUMENTS 5,394,969 A    3/1995    Harbaugh
5,550,066 A    8/1996    Tang et al.
(Continued)

FOREIGN PATENT DOCUMENTS

DE    102013102003 A1    8/2014
EP    1 560 718 B1    3/2007
(Continued)

OTHER PUBLICATIONS

Lee, S. H. etal, Laser Lift-Offof GaN Thin Film and its Application to the Flexible Light Emitting Diodes, Proc. of SPIE 8460:846011-1-846011-6 (2012).
(Continued)

*Primary Examiner* — Hung T Nguyen
(74) *Attorney, Agent, or Firm* — William R. Haulbrook; Alexander D. Augst; Choate, Hall & Stewart LLP

(57) ABSTRACT

A wirelessly powered display comprises a substrate, an antenna with multiple turns disposed on the substrate, an electronic circuit disposed on the substrate, and one or more pixels each having one or more inorganic light-emitting diodes disposed on the substrate. The electronic circuit is electrically connected to the one or more inorganic LEDs and the antenna, the antenna is responsive to electromagnetic energy to provide electrical power, and the electronic circuit includes a power converter that converts a signal with a relatively high current and low voltage to a signal with a relatively high voltage and low current. A wirelessly coupled display system includes a device including a wireless power transmitter that provides wireless power within a specified range and one or more wirelessly powered displays located within the range and responsive to the wireless power provided by the device to display an image.

19 Claims, 15 Drawing Sheets

Related U.S. Application Data

(60) Provisional application No. 62/324,578, filed on Apr. 19, 2016.

(51) Int. Cl.
| | | |
|---|---|---|
| *H02J 50/10* | (2016.01) | |
| *H01Q 1/24* | (2006.01) | |
| *H03H 9/46* | (2006.01) | |
| *H04B 5/00* | (2006.01) | |
| *H04M 1/02* | (2006.01) | |
| *G06K 19/07* | (2006.01) | |
| *G06K 19/077* | (2006.01) | |
| *H01L 25/16* | (2006.01) | |
| *G07D 7/01* | (2016.01) | |
| *H01L 25/075* | (2006.01) | |

(52) U.S. Cl.
CPC . *G06K 19/07705* (2013.01); *G06K 19/07749* (2013.01); *G07D 7/01* (2017.05); *H01L 25/167* (2013.01); *H01Q 1/242* (2013.01); *H02J 50/10* (2016.02); *H03H 9/46* (2013.01); *H04B 5/0037* (2013.01); *H04M 1/0266* (2013.01); *G09G 2300/04* (2013.01); *G09G 2330/02* (2013.01); *G09G 2370/16* (2013.01); *H01L 25/0753* (2013.01)

(58) Field of Classification Search
CPC ......... G06K 19/0709; G06K 19/07705; G06K 7/00; G06K 19/0723; G06K 19/071; G08B 5/36; G08B 25/10; H04M 1/0266; H04B 5/0037; H02J 50/10; G09G 2300/04; G09G 2370/16; G09G 3/32; H01Q 1/242
USPC ............. 340/539.1, 539.23, 539.11; 194/207
See application file for complete search history.

(56) References Cited

U.S. PATENT DOCUMENTS

| | | | |
|---|---|---|---|
| 5,621,555 | A | 4/1997 | Park |
| 5,815,303 | A | 9/1998 | Berlin |
| 5,994,722 | A | 11/1999 | Averbeck et al. |
| 6,084,579 | A | 7/2000 | Hirano |
| 6,131,718 | A | 10/2000 | Witschorik |
| 6,142,358 | A | 11/2000 | Cohn et al. |
| 6,169,294 | B1 | 1/2001 | Biing-Jye et al. |
| 6,184,477 | B1 | 2/2001 | Tanahashi |
| 6,278,242 | B1 | 8/2001 | Cok et al. |
| 6,392,340 | B2 | 5/2002 | Yoneda et al. |
| 6,466,281 | B1 | 10/2002 | Huang et al. |
| 6,577,367 | B2 | 6/2003 | Kim |
| 6,659,351 | B1 | 12/2003 | Bailleu et al. |
| 6,660,457 | B1 | 12/2003 | Imai et al. |
| 6,703,780 | B2 | 3/2004 | Shiang et al. |
| 6,717,560 | B2 | 4/2004 | Cok et al. |
| 6,756,576 | B1 | 6/2004 | McElroy et al. |
| 6,812,637 | B2 | 11/2004 | Cok et al. |
| 6,828,724 | B2 | 12/2004 | Burroughes |
| 6,933,532 | B2 | 8/2005 | Arnold et al. |
| 7,012,382 | B2 | 3/2006 | Cheang et al. |
| 7,091,523 | B2 | 8/2006 | Cok et al. |
| 7,098,589 | B2 | 8/2006 | Erchak et al. |
| 7,129,457 | B2 | 10/2006 | McElroy et al. |
| 7,195,733 | B2 | 3/2007 | Rogers et al. |
| 7,288,753 | B2 | 10/2007 | Cok |
| 7,402,951 | B2 | 7/2008 | Cok |
| 7,420,221 | B2 | 9/2008 | Nagai |
| 7,466,075 | B2 | 12/2008 | Cok et al. |
| 7,521,292 | B2 | 4/2009 | Rogers et al. |
| 7,557,367 | B2 | 7/2009 | Rogers et al. |
| 7,586,497 | B2 | 9/2009 | Boroson et al. |
| 7,622,367 | B1 | 11/2009 | Nuzzo et al. |
| 7,662,545 | B2 | 2/2010 | Nuzzo et al. |
| 7,687,812 | B2 | 3/2010 | Louwsma et al. |
| 7,688,270 | B2 | 3/2010 | Tsushima |
| 7,704,684 | B2 | 4/2010 | Rogers et al. |
| 7,791,271 | B2 | 9/2010 | Cok et al. |
| 7,799,699 | B2 | 9/2010 | Nuzzo et al. |
| 7,816,856 | B2 | 10/2010 | Cok et al. |
| 7,834,541 | B2 | 11/2010 | Cok |
| 7,861,937 | B2 | 1/2011 | Lazzerini |
| 7,893,612 | B2 | 2/2011 | Cok |
| 7,919,342 | B2 | 4/2011 | Cok |
| 7,927,976 | B2 | 4/2011 | Menard |
| 7,932,123 | B2 | 4/2011 | Rogers et al. |
| 7,943,491 | B2 | 5/2011 | Nuzzo et al. |
| 7,969,085 | B2 | 6/2011 | Cok |
| 7,972,875 | B2 | 7/2011 | Rogers et al. |
| 7,982,296 | B2 | 7/2011 | Nuzzo et al. |
| 7,990,058 | B2 | 8/2011 | Cok et al. |
| 7,999,454 | B2 | 8/2011 | Winters et al. |
| 8,029,139 | B2 | 10/2011 | Ellinger et al. |
| 8,039,847 | B2 | 10/2011 | Nuzzo et al. |
| 8,056,820 | B2 | 11/2011 | Camus et al. |
| 8,198,621 | B2 | 6/2012 | Rogers et al. |
| 8,207,547 | B2 | 6/2012 | Lin |
| 8,243,027 | B2 | 8/2012 | Hotelling et al. |
| 8,253,536 | B2 | 8/2012 | Kaminska et al. |
| 8,261,660 | B2 | 9/2012 | Menard |
| 8,288,843 | B2 | 10/2012 | Kojima et al. |
| 8,334,545 | B2 | 12/2012 | Levermore et al. |
| 8,391,688 | B2 | 3/2013 | Zhang et al. |
| 8,394,706 | B2 | 3/2013 | Nuzzo et al. |
| 8,436,780 | B2 | 5/2013 | Schantz et al. |
| 8,440,546 | B2 | 5/2013 | Nuzzo et al. |
| 8,450,927 | B2 | 5/2013 | Lenk et al. |
| 8,470,701 | B2 | 6/2013 | Rogers et al. |
| 8,502,192 | B2 | 8/2013 | Kwak et al. |
| 8,506,867 | B2 | 8/2013 | Menard |
| 8,528,813 | B1 | 9/2013 | Blossom |
| 8,664,699 | B2 | 3/2014 | Nuzzo et al. |
| 8,686,447 | B2 | 4/2014 | Tomoda et al. |
| 8,722,458 | B2 | 5/2014 | Rogers et al. |
| 8,735,932 | B2 | 5/2014 | Kim et al. |
| 8,754,396 | B2 | 6/2014 | Rogers et al. |
| 8,766,970 | B2 | 7/2014 | Chien et al. |
| 8,791,474 | B1 | 7/2014 | Bibl et al. |
| 8,791,822 | B2 | 7/2014 | Delia et al. |
| 8,794,501 | B2 | 8/2014 | Bibl et al. |
| 8,803,857 | B2 | 8/2014 | Cok |
| 8,817,369 | B2 | 8/2014 | Daiku |
| 8,854,294 | B2 | 10/2014 | Sakariya |
| 8,860,051 | B2 | 10/2014 | Fellows et al. |
| 8,877,648 | B2 | 11/2014 | Bower et al. |
| 8,884,844 | B2 | 11/2014 | Yang et al. |
| 8,889,485 | B2 | 11/2014 | Bower |
| 8,895,406 | B2 | 11/2014 | Rogers et al. |
| 8,902,152 | B2 | 12/2014 | Bai et al. |
| 8,946,760 | B2 | 2/2015 | Kim |
| 8,987,765 | B2 | 3/2015 | Bibl et al. |
| 9,153,171 | B2 | 10/2015 | Sakariya et al. |
| 9,202,996 | B2 | 12/2015 | Orsley et al. |
| 9,460,665 | B2 | 10/2016 | Jiang et al. |
| 9,520,537 | B2 | 12/2016 | Bower et al. |
| 9,626,908 | B2 | 4/2017 | Sakariya et al. |
| 2001/0022564 | A1 | 9/2001 | Youngquist et al. |
| 2002/0096994 | A1 | 7/2002 | Iwafuchi et al. |
| 2003/0006121 | A1* | 1/2003 | Lee ................... G07D 7/0093 194/206 |
| 2003/0164611 | A1 | 9/2003 | Schneider et al. |
| 2004/0061572 | A1 | 4/2004 | Nakamura |
| 2004/0099580 | A1* | 5/2004 | Brotherston ............ B65H 1/06 209/583 |
| 2004/0212296 | A1 | 10/2004 | Nakamura et al. |
| 2004/0227704 | A1 | 11/2004 | Wang et al. |
| 2004/0252933 | A1 | 12/2004 | Sylvester et al. |
| 2005/0006657 | A1 | 1/2005 | Terashita |
| 2005/0012076 | A1 | 1/2005 | Morioka |
| 2005/0116621 | A1 | 6/2005 | Bellmann et al. |
| 2005/0140275 | A1 | 6/2005 | Park |
| 2005/0150740 | A1 | 7/2005 | Finkenzeller et al. |

(56) References Cited

U.S. PATENT DOCUMENTS

| | | |
|---|---|---|
| 2005/0168987 A1 | 8/2005 | Tamaoki et al. |
| 2005/0177480 A1 | 8/2005 | Huang |
| 2005/0275615 A1 | 12/2005 | Kahen et al. |
| 2006/0063309 A1 | 3/2006 | Sugiyama et al. |
| 2007/0035340 A1 | 2/2007 | Kimura |
| 2007/0077349 A1 | 4/2007 | Newman et al. |
| 2007/0201056 A1 | 8/2007 | Cok et al. |
| 2008/0035736 A1 | 2/2008 | Tompkin et al. |
| 2008/0211734 A1 | 9/2008 | Huitema et al. |
| 2009/0315054 A1 | 12/2009 | Kim et al. |
| 2010/0078670 A1 | 4/2010 | Kim et al. |
| 2010/0084850 A1 | 4/2010 | Jackson et al. |
| 2010/0123268 A1 | 5/2010 | Menard |
| 2010/0148198 A1 | 6/2010 | Sugizaki et al. |
| 2010/0214247 A1 | 8/2010 | Tang et al. |
| 2010/0248484 A1 | 9/2010 | Bower et al. |
| 2010/0258710 A1 | 10/2010 | Wiese et al. |
| 2010/0317132 A1 | 12/2010 | Rogers et al. |
| 2011/0207328 A1* | 8/2011 | Speakman .......... H01L 51/0011 438/694 |
| 2011/0211348 A1 | 9/2011 | Kim |
| 2012/0119249 A1 | 5/2012 | Kim et al. |
| 2012/0223875 A1 | 9/2012 | Lau et al. |
| 2012/0228669 A1 | 9/2012 | Bower et al. |
| 2012/0314388 A1 | 12/2012 | Bower et al. |
| 2012/0325915 A1 | 12/2012 | Kato et al. |
| 2013/0015483 A1 | 1/2013 | Shimokawa et al. |
| 2013/0069275 A1 | 3/2013 | Menard et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0273695 A1 | 10/2013 | Menard et al. |
| 2014/0104243 A1 | 4/2014 | Sakariya et al. |
| 2014/0132995 A1* | 5/2014 | Tietke .................. G06K 7/0008 358/434 |
| 2014/0175498 A1 | 6/2014 | Lai |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0264763 A1 | 9/2014 | Meitl et al. |
| 2014/0267683 A1 | 9/2014 | Bibl et al. |
| 2014/0300095 A1 | 10/2014 | Tompkin et al. |
| 2014/0306248 A1 | 10/2014 | Ahn et al. |
| 2014/0367633 A1 | 12/2014 | Bibl et al. |
| 2014/0367705 A1 | 12/2014 | Bibl et al. |
| 2015/0028107 A1* | 1/2015 | Fischer ............ G06K 19/07783 235/488 |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0280792 A1* | 10/2015 | Chen ...................... H02J 5/005 307/104 |
| 2015/0363614 A1 | 12/2015 | Yeager et al. |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0373793 A1 | 12/2015 | Bower et al. |
| 2016/0004947 A1 | 1/2016 | Pueschner et al. |
| 2016/0005721 A1 | 1/2016 | Bower et al. |
| 2016/0018094 A1 | 1/2016 | Bower et al. |
| 2016/0064363 A1 | 3/2016 | Bower et al. |
| 2016/0068005 A1 | 3/2016 | Fischer et al. |
| 2016/0093600 A1 | 3/2016 | Bower et al. |
| 2017/0206845 A1 | 7/2017 | Sakariya et al. |
| 2017/0246899 A1 | 8/2017 | Cok et al. |
| 2017/0302336 A1 | 10/2017 | Rotzoll et al. |
| 2017/0313119 A1 | 11/2017 | Cok et al. |
| 2017/0345243 A1 | 11/2017 | Rotzoll et al. |

FOREIGN PATENT DOCUMENTS

| | | |
|---|---|---|
| EP | 2 062 204 B1 | 3/2012 |
| EP | 1 059 620 B1 | 2/2013 |
| EP | 1 301 355 B2 | 11/2015 |
| GB | 2 496 183 A | 5/2013 |
| WO | WO-2004/056583 A1 | 7/2004 |
| WO | WO-2006/027730 A1 | 3/2006 |
| WO | WO-2006/099741 A1 | 9/2006 |
| WO | WO-2008/103931 A2 | 8/2008 |
| WO | WO-2010/032603 A1 | 3/2010 |
| WO | WO-2010/111601 A2 | 9/2010 |
| WO | WO-2010/132552 A1 | 11/2010 |
| WO | WO-2013/064800 A1 | 5/2013 |
| WO | WO-2013/165124 A1 | 11/2013 |
| WO | WO-2014/121635 A1 | 8/2014 |
| WO | WO-2014/149864 A1 | 9/2014 |
| WO | WO-2016/037895 A1 | 3/2016 |
| WO | WO-2017/148875 A1 | 9/2017 |
| WO | WO-2017/0182488 A2 | 10/2017 |

OTHER PUBLICATIONS

Roscher, H., VCSEL Arrays with Redundant Pixel Designs for 10Gbits/s 2-D Space-Parallel MMF Transmission, Annual Report, optoelectronics Department, (2005).

Yaniv et al., A 640×480 Pixel Computer Display Using Pin Diodes with Device Redundancy, 1988 International Display Research Conference, IEEE, CH-2678-1/88:152-154 (1988).

Provisional Opinion Accompanying the Partial Search Report, PCT/EP2017/059221 (Wirelessly Powered Display and System, filed Apr. 19, 2017) issued by ISA/EP 11 pages (Sep. 18, 2017).

Partial Search Report, PCT/EP2017/059221 (Wirelessly Powered Display and System, filed Apr. 19, 2017) issued by ISA/EP 2 pages (Sep. 18, 2017).

International Search Report, PCT/EP2017/059221 (Wirelessly Powered High Security Document With Visual Indicator and Systems filed Apr. 19, 2017), 6 pages, Dec. 1, 2017.

Written Opinion, PCT/EP2017/059221 (Wirelessly Powered High Security Document With Visual Indicator and Systems, filed Apr. 19, 2017), 14 pages, Dec. 1, 2017.

* cited by examiner

Smartphone NFC reader antenna about 4.5 × 5.5 cm². Light-emitting module is center dot.

| Reader Parameters in Read Volume | | | | | |
|---|---|---|---|---|---|
| Emitted Frequency | 13.56 | 13.56 | 13.56 | 13.56 | 13.56 MHz |
| Minimum Magnetic Field Strength | 1.5 | 1.5 | 1.5 | 7.5 | 1.5 A/m |
| Permeability of Free Space | 1.257E-06 | 1.257E-06 | 1.257E-06 | 1.257E-06 | 1.257E-06 H/m |
| Minimum Magnetic Flux Density | 1.885E-06 | 1.885E-06 | 1.885E-06 | 9.425E-06 | 1.885E-06 T |
| | | | | | |
| Target NFC Device | | | | | |
| Required Extracted Power | 1 | 1 | 1 | 25 | 10 uW |
| Conductivity of Coil Metal (Al) | 3.77E+07 | 3.77E+07 | 3.77E+07 | 3.77E+07 | 3.77E+07 /ohm-m |
| Target Coil Height | 5 | 20 | 529 | 20 | 26 um |
| Outside Coil Dimension | 1699 | 1201 | 530 | 1201 | 2001 um |
| Turns x Width | 566 | 400 | 177 | 400 | 667 um |
| Coil Turn Width | 25 | 25 | 50 | 25 | 25 um |
| Turns Count | 23 | 17 | 4 | 17 | 27 turns |
| | | | | | |
| Coil RMS Voltage | 4.738 | 1.751 | 0.080 | 8.755 | 7.713 mV |
| Coil Resistance | 22.11 | 2.89 | 0.01 | 2.89 | 5.88 ohm |
| Coil Power | 1.02E+00 | 1.06E+00 | 1.13E+00 | 2.65E+00 | 1.01E+01 uW |
| | | | | | |
| Coil Volume | 14.43 | 28.86 | 148.44 | 28.86 | 104.06 Mum^3 |
| Coil Estimated Inductance | 0.91 | 0.36 | 0.01 | 0.36 | 1.48 uH |
| Coil Estimated Q | 3.525670809 | 10.53821 | 151.21296 | 10.538213 | 21.43712 |
| | | | | | |
| RF Multiplier Output Voltage | 0.5 | 0.5 | 0.5 | 0.5 | 0.5 V |
| RF Multiplier Loaded Q | 105.5243904 | 285.5366 | 6241.134 | 57.107317 | 64.82143 |
| Is Q < 1000? | YES | YES | NO | YES | YES |
| | | | | | |
| Width Coil Center Opening | 566 | 400 | 177 | 400 | 667 um |

*FIG. 14*

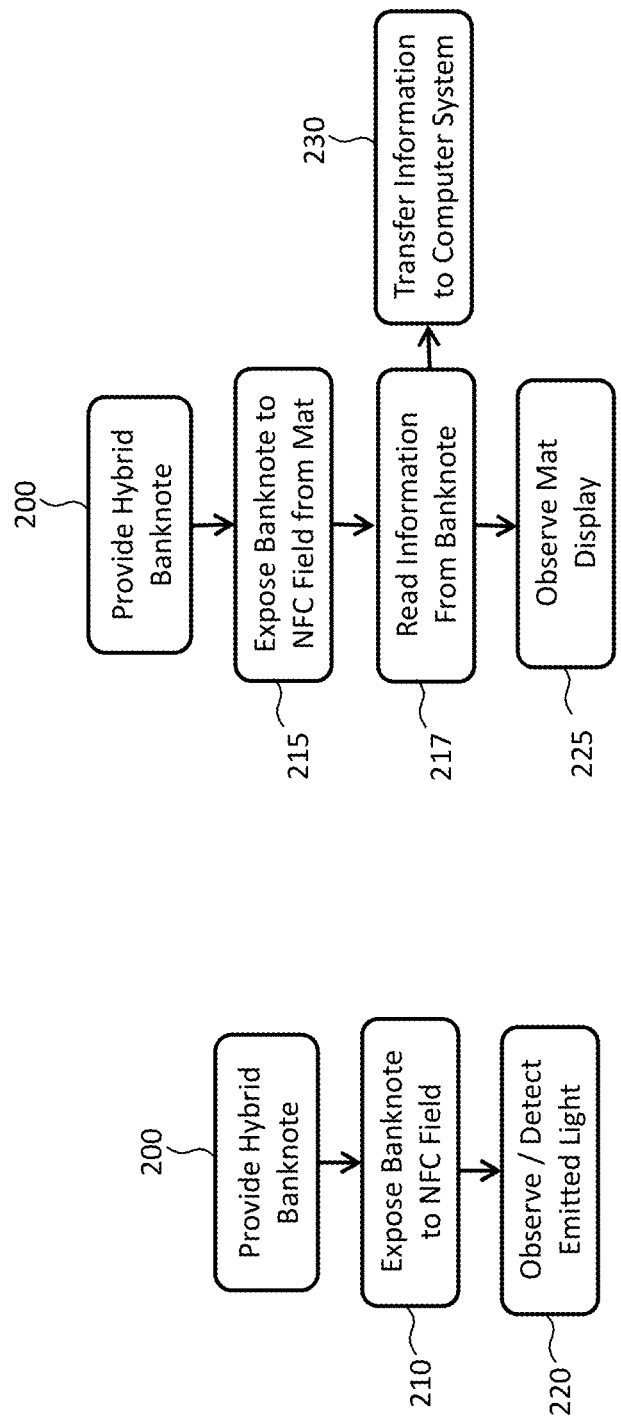

WIRELESSLY POWERED DISPLAY AND SYSTEM

PRIORITY APPLICATION

This application is a Continuation-in-Part of U.S. patent application Ser. No. 15/157,838, filed May 18, 2016, entitled Hybrid Banknote with Electronic Indicia using Near-Field-Communications, which claims priority to and benefit of U.S. Patent Application No. 62/324,578, filed Apr. 19, 2016, entitled Hybrid Banknote with Electronic Indicia using Near-Field-Communications, the disclosures of which are incorporated by reference herein in their entirety.

FIELD OF THE INVENTION

The present invention relates to electronically controlled inorganic-light-emitting diode displays operated using wirelessly transmitted power.

BACKGROUND OF THE INVENTION

Monetary instruments issued by governments such as money or currency are used throughout the world today. Government-issued currency typically includes banknotes (also known as paper currency or bills) having visible markings printed on high-quality paper, plastic, or paper impregnated with other materials, such as plastic. The visible markings indicate the denomination (value) of the banknote and include a serial number, decorations such as images, and anti-counterfeiting structures such as special threads, ribbons, and holograms. Currency circulates within an economic system as a medium of monetary exchange having a fixed value until it is physically worn out. Worn out banknotes are generally returned by banks or other financial institutions and then replaced.

Other privately issued monetary instruments, such as credit cards and gift cards, are also used by the public. These cards typically include an electronically accessible value (e.g., stored in a magnetic stripe or in a chip in the card) or an electronically accessible account that can be used to make purchases. However, the electronically stored value of the card is not readily viewed by a user.

In the past, banknotes have not been electronically enabled. However, more recently there have been proposals to use RFID (radio-frequency identification device) in banknotes to validate the banknote and avoid counterfeiting. For example, U.S. Pat. No. 8,391,688 and U.S. Pat. No. 8,791,822 disclose systems for currency validation. U.S. Pat. No. 5,394,969 describes a capacitance-based verification device for a security thread embedded within currency paper to defeat counterfeiting. Security systems for scanning a paper banknote and checking identification information in the banknote (e.g., the serial number) with a network-accessible database have been proposed, for example in U.S. Pat. No. 6,131,718.

Near-field-communications (NFC) systems also provide an electronic response to electromagnetic stimulation for enabling financial transactions by employing a set of electromagnetic communication protocols that enable two electronic devices, one of which is usually a portable device such as a smartphone, to communicate by bringing them within 4 cm of each other. These devices use electromagnetic induction between two loop antennae to communicate and transmit power, for example as disclosed in U.S. Pat. No. 7,688,270. Thus, at least one of the devices can operate without a stored energy device such as a battery. In all of these systems, however, there is no way to visibly and electronically test attributes of a banknote.

There remains a need, therefore, for currency with visible indicia that is electronically accessible.

SUMMARY OF THE INVENTION

The present invention provides a wirelessly powered display having a substrate, for example a display substrate. One or more pixels each having one or more inorganic light-emitting diodes are disposed on the substrate. An antenna with multiple turns and an electronic circuit are also disposed on the substrate. The electronic circuit is electrically connected to the one or more inorganic LEDs and the antenna. The antenna is responsive to electromagnetic energy to provide electrical power, and the electronic circuit includes a power converter that converts a signal with a relatively high current and low voltage to a signal with a relatively high voltage and low current. Each wirelessly powered display can be a light-emitting module that wirelessly displays an image.

The wirelessly powered display can rely on electromagnetic radiation for all of its power and control needs and can therefore exclude a battery, internal power source, or wired power source and can operate solely on the electrical power provided through the antenna.

In various embodiments, the wirelessly powered display has a single pixel or the wirelessly powered display has multiple pixels. The wirelessly displayed image is a fixed image, a variable image, a still image, or an image sequence. The wirelessly powered display can comprise an acoustic wave filter, a surface acoustic wave filter, or a bulk acoustic wave filter and can be or incorporate a sticker.

In a further embodiment of the present invention, a wirelessly coupled display system comprises a device that includes a wireless power transmitter providing wireless power within a specified range and one or more wirelessly powered displays located within the range and responsive to wireless power provided by the device to display an image. The device can be a portable device or a mobile device and can be a mobile telephone or a smart phone. The wirelessly powered display can be located in a fixed location. Alternatively, in an embodiment, the wirelessly powered display is mobile or affixed to a mobile telephone, smart phone, or other portable device such as a computer or camera. The wirelessly powered display can be mounted on the device or can be physically separate from the device. In a configuration, the device includes a primary device display and the wirelessly powered display is a secondary display mounted on or incorporated into the device.

In an embodiment, the wireless power transmitter is a near-field communication (NFC) device. The device of the wirelessly coupled display system can include a stored image and an image transmitter circuit that wirelessly provides the stored image to the display. The display is responsive to the wirelessly provided image to display the image. In an embodiment, the display includes a display controller, for example incorporated into the electronic circuit.

In an embodiment, the wirelessly powered display system includes one or multiple displays. Each display has an identification and a circuit for responding to the identification when the identification is transmitted. The device includes a transmitter circuit that wirelessly provides one or more of the identifications to the one or more displays so that an identified display can respond to a signal from the device where the other displays not so identified do not respond.

The wirelessly powered display can be provided in a hybrid high-security document having one or more light-emitting modules (i.e., wirelessly powered displays) disposed on or embedded in a document with or without visible markings. The document can be a conventional printed document such as a label, a commercial document such as a certificate, a stock certificate, a bond, or a bearer bond or a government-issued document such as a passport, a monetary instrument, or a license and can include additional anti-counterfeiting features such as are found in high-security documents. In an embodiment, and as described herein, a banknote is a high-security document. Other high-security documents include passports and identification cards such as driver's licenses or other government-issued identification.

Each light-emitting module comprises an antenna with multiple turns, an electronic circuit, and a light emitter mounted and electrically connected on a substrate separate and independent from the document except insofar as the one is affixed to the other. The electronic circuit is responsive to electrical power provided from the antenna to control the light emitter to emit light. In an embodiment, the electronic circuit and LED are powered solely by the energy received from the antenna. The electronic circuit can include a memory storing information relevant to the hybrid high-security document or its use. The information can be accessed by external readers providing electromagnetic energy to the hybrid high-security document.

In another embodiment, a multi-element light-emitting system comprises a plurality of independent light-emitting modules. Each independent light-emitting module includes an antenna with multiple turns, an electronic circuit, and a light emitter mounted and electrically connected on a separate substrate. The independent light-emitting modules are disposed in a pattern to form a visible indicator.

In an embodiment, a hybrid banknote mat includes a mat circuit and an antenna. The mat circuit provides a continuous or pulsed NFC signal having a pulse rate of ten, twenty, fifty, or one hundred pulses per second or greater.

A method of making a hybrid high-security document includes providing a document having visible markings, providing a source having a plurality of printable light-emitting modules, and printing one or more of the light-emitting modules onto the document or onto a flexible substrate, ribbon, film, or thread subsequently incorporated in, laminated to, or woven into the document.

A method of using a hybrid banknote comprises providing a hybrid high-security document, exposing the hybrid high-security document to an electromagnetic field so that the antenna provides power to the electronic circuit and causes the light emitter to emit light, and observing the light or detecting the light with a light detector.

In an embodiment, the electronic circuit stores information, and the method further comprises providing the electromagnetic field, reading the information, and displaying the information on a display or transferring the information to a computer system.

The electronic circuit can include a memory, for example a read-only memory or a write-once memory storing one or more values. Multiple values can be stored in a sequential order corresponding to a temporally sequential set of values and can monotonically decline in magnitude. Values stored in the hybrid high-security document can be electronically read by a teller machine having a reader and the value of the high-security document displayed on the teller machine. In a further embodiment, the teller machine can write a value to the high-security document using a writer. In an embodiment, the electronic circuit controls the written value so that it must be equal to or smaller than a value already stored in the high-security document.

A user can insert a received hybrid high-security document into a teller machine, input an input value to the teller machine, and the teller machine can write a value derived from the input value into the hybrid high-security document. The input value can represent the value of a monetary transaction, for example a purchase of goods or payment of debt and the difference between the input value and the current value can be written into the hybrid high-security document.

The present invention provides an anonymous, government-issued currency with anti-counterfeiting light emitters whose value or indicia can be visibly ascertained and can be modified electronically.

In one aspect, the disclosed technology includes a wirelessly powered display, including: a substrate; an antenna with multiple turns disposed on the substrate; an electronic circuit disposed on the substrate; and one or more pixels each having one or more inorganic light-emitting diodes disposed on the substrate; wherein: the electronic circuit is electrically connected to the one or more inorganic LEDs and the antenna; the antenna is responsive to electromagnetic energy to provide electrical power; and the electronic circuit includes a power converter that converts a signal with a relatively high current and low voltage to a signal with a relatively high voltage and low current.

In certain embodiments, the display excludes a battery, internal power source, or wired power source and the display operates solely on the electrical power provided through the antenna.

In certain embodiments, the display has a single pixel.

In certain embodiments, the display has multiple pixels.

In certain embodiments, the display is a sticker.

In certain embodiments, the displayed image is a fixed image.

In certain embodiments, the display comprises an acoustic wave filter, a surface acoustic wave filter, or a bulk acoustic wave filter.

In another aspect, the disclosed technology includes a wirelessly coupled display system, including: a device including a wireless power transmitter that provides wireless power within a specified range; and one or more wirelessly powered displays located within the range and responsive to the wireless power provided by the device to display an image, wherein each wirelessly powered display comprises: a substrate; an antenna with multiple turns disposed on the substrate; an electronic circuit disposed on the substrate; and one or more pixels each having one or more inorganic light-emitting diodes disposed on the substrate; wherein: the electronic circuit is electrically connected to the one or more inorganic LEDs and the antenna; the antenna is responsive to electromagnetic energy to provide electrical power; and the electronic circuit includes a power converter that converts a signal with a relatively high current and low voltage to a signal with a relatively high voltage and low current.

In certain embodiments, the device is a portable device, the device is a mobile device, the display is in a fixed location, or the display is mobile or affixed to a mobile device or portable device.

In certain embodiments, the display is mounted on the device.

In certain embodiments, the one or more displays are physically separate from the device.

In certain embodiments, the wireless power transmitter is a near-field communication device.

In certain embodiments, the device is a mobile telephone or a smart phone.

In certain embodiments, the device includes a stored image and an image transmitter circuit that wirelessly provides the stored image to the display; and the display is responsive to the wirelessly provided image to display the image.

In certain embodiments, the display includes a display controller.

In certain embodiments, the device includes a primary device display and the display is a secondary display mounted on or incorporated into the device.

In certain embodiments, each display has an identification and a circuit for responding to the identification when the identification is transmitted; and the device includes a transmitter circuit that wirelessly provides one or more of the identifications to the one or more displays.

In another aspect, the disclosed technology includes a wirelessly powered display, including: a substrate; and a plurality of light-emitting modules disposed on the substrate, each light-emitting module having an antenna with multiple turns disposed on the substrate, an electronic circuit disposed on the substrate, and one or more pixels each having one or more inorganic light-emitting diodes disposed on the substrate; wherein, for each light-emitting module, the electronic circuit is electrically connected to the one or more inorganic LEDs and the antenna, the antenna is responsive to electromagnetic energy to provide electrical power, and the electronic circuit includes a power converter that converts a signal with a relatively high current and low voltage to a signal with a relatively high voltage and low current.

In another aspect, the disclosed technology includes a wirelessly coupled display system, including: a device including a wireless power transmitter that provides wireless power within a specified range; and a wirelessly powered display located within the range and responsive to the wireless power provided by the device to display an image, wherein the wirelessly powered display includes: a substrate; and a plurality of light-emitting modules disposed on the substrate, each light-emitting module having an antenna with multiple turns disposed on the substrate, an electronic circuit disposed on the substrate, and one or more pixels each having one or more inorganic light-emitting diodes disposed on the substrate; wherein, for each light-emitting module, the electronic circuit is electrically connected to the one or more inorganic LEDs and the antenna, the antenna is responsive to electromagnetic energy to provide electrical power, and the electronic circuit comprises a power converter that converts a signal with a relatively high current and low voltage to a signal with a relatively high voltage and low current.

In another aspect, the disclosed technology includes a wirelessly powered display, including: a plurality of substrates, each substrate having an antenna with multiple turns disposed on the substrate, an electronic circuit disposed on the substrate, and one or more pixels each having one or more inorganic light-emitting diodes disposed on the substrate; wherein on each substrate the electronic circuit is electrically connected to the one or more inorganic LEDs and the antenna, the antenna is responsive to electromagnetic energy to provide electrical power, and the electronic circuit includes a power converter that converts a signal with a relatively high current and low voltage to a signal with a relatively high voltage and low current.

In another aspect, the disclosed technology includes a wirelessly coupled display system, including: a device including a wireless power transmitter that provides wireless power within a specified range; and one or more wirelessly powered displays located within the range and responsive to the wireless power provided by the device to display an image, wherein each wirelessly powered displays each comprise a plurality of substrates, each substrate having an antenna with multiple turns disposed on the substrate, an electronic circuit disposed on the substrate, and one or more pixels each having one or more inorganic light-emitting diodes disposed on the substrate; wherein on each substrate the electronic circuit is electrically connected to the one or more inorganic LEDs and the antenna, the antenna is responsive to electromagnetic energy to provide electrical power, and the electronic circuit includes a power converter that converts a signal with a relatively high current and low voltage to a signal with a relatively high voltage and low current.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 14 is a table showing design alternatives according to corresponding embodiments of the present invention;

FIGS. 17 and 18 are flow charts illustrating methods of the present invention;

The features and advantages of the present disclosure will become more apparent from the detailed description set forth below when taken in conjunction with the drawings, in

DETAILED DESCRIPTION OF THE INVENTION

Figures 1, 2:
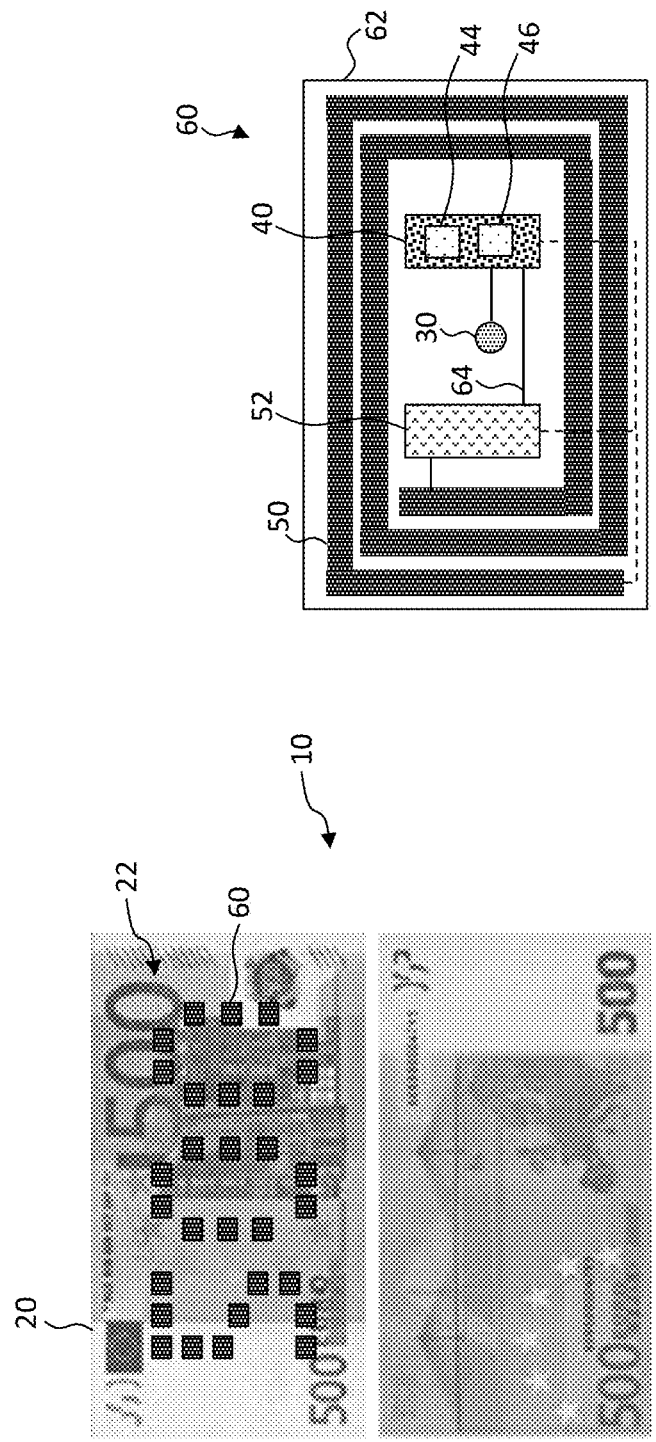
FIG. 1 is a plan view of the front and back sides of a hybrid banknote in an embodiment of the present invention.
FIG. 2 is a schematic diagram according to an embodiment of the present invention.

Referring to FIG. 1, in an embodiment of the present invention a hybrid high-security document 10 includes a document 20 and one or more independent light-emitting modules 60 (i.e. wirelessly powered displays 60). The document 20 can be a conventional printed document such as a label, a commercial document such as a certificate, a stock certificate, a bond, or a bearer bond or a government-issued document such as a passport, a monetary instrument, or a license and can include additional anti-counterfeiting features such as are found in high-security documents. A high-security document is a document that includes a security feature and the document 20 can be a high-security document. In an embodiment, and as described herein, a banknote 20 is a high-security document. Other high-security documents 20 include passports and identification cards such as driver's licenses or other government-issued identification. As used herein, the term "banknote" is used synonymously with high-security document and any reference to "banknote" can also be a reference to a high-security document. The banknote 20 can be a government-issued banknote 20 and can include visible markings 22 such as value indicators, decorative elements, and anti-counterfeiting structures or markings.

The light-emitting modules 60 are disposed on or embedded in the banknote 20, for example disposed on or embedded in the material on which the visible markings 22 are printed or disposed on or embedded in other elements of the banknote 20, such as a thread, ribbon, film, decal, or flexible substrate. Each light-emitting module 60 comprises an antenna 50 with multiple turns, an electronic circuit 40, and a light emitter 30 mounted and electrically connected on a substrate 62 separate and independent from the document except insofar as the one is affixed to the other. Referring also to FIG. 2, each light-emitting module 60 includes an antenna 50, for example a near-field communication (NFC) antenna or an RFID antenna that provides electrical power to the electronic circuit 40 in response to received electromagnetic radiation so that the electronic circuit 40 is responsive to electrical power provided from the antenna 50 to control the light emitter 30 to emit light. In an embodiment, the electronic circuit 40 and light emitter 30 are powered solely by the energy received from the antenna 50 and the electronic circuit 40 or hybrid high-security document 10 does not include any devices for storing energy between uses, such as a battery.

The electronic circuit 40 can include a memory 44 for storing information. The electronic circuit 40 is connected to a light emitter 30 and includes circuitry for controlling the light emitter 30 to emit light when electrical power is provided from the antenna 50. The light-emitting module 60 can include a power converter that converts a signal with a relatively high current and low voltage to a signal with a relatively high voltage and low current. The light-emitting module 60 can also or alternatively include an acoustic wave filter 52 for converting the impedance of the electrical power provided from the antenna 50 in response to received electromagnetic radiation. The acoustic wave filter 52 can be the power converter. The electronic circuit 40, light emitter 30, and optional acoustic wave filter 52 can be mounted or otherwise disposed on a substrate 62, for example by micro-transfer printing. The antenna 50 can be formed on or in or disposed on the substrate 62. Electrical wires 64 can also be formed at least partly on or in the substrate 62 to electrically connect the antenna 50, optional acoustic wave filter 52, electronic circuit 40 and light emitter 30.

The electronic circuit 40 (and optional memory 44) can be, or is a part of, or can include an integrated circuit and, in an embodiment, can be or include a small micro-transfer printable integrated circuit such as a chiplet, or a semiconductor for example having an area less than 100,000, 50,000, 20,000, 10,000, 5,000, 1,000, 500, 250, or 100 square microns. In a further embodiment, the light-emitting module 60 can be a small micro-transfer printable module, for example formed on a semiconductor or other substrate such as glass or plastic having an area less than 100,000, 50,000, 20,000, 10,000, 5,000, 1,000, 500, 250, or 100 square microns. The acoustic wave filter 52 can be a surface acoustic wave filter (SAW) or bulk acoustic wave filter (BAW), for example including AlN, and the light emitter 30 can be an inorganic light-emitting diode (iLED) 32, for example made with a compound semiconductor such as GaN or AlGaN.

Figure 3:
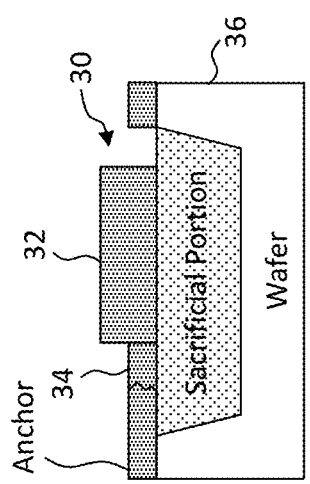
FIG. 3 is a schematic illustration of a light emitter with a fractured tether according to an embodiment of the present invention.

Micro-transfer printable iLED 32 devices (or other devices e.g., chiplets, integrated circuits, or acoustic wave filters 52) can be formed in or on a source wafer 36 over a sacrificial portion of a sacrificial layer that, when etched, forms a tether 34 (FIG. 3) connecting the micro-transfer printable device to an anchor portion of the wafer. When transferred by a printing stamp from the wafer to a destination substrate, such as the substrate 62, the tether 34 is fractured so that a micro-transfer printed device has a fractured tether 34, as illustrated in FIG. 3. FIG. 3 is a simple illustration of an iLED 32 with a fractured tether 34 over a sacrificial portion of a source wafer. In other embodiments, the tether 34 is located beneath the micro-transfer printable device (e.g., inorganic light-emitting diode 32) or the micro-transfer printable device is held in place by the sacrificial portion to the anchor portion.

Figure 4:
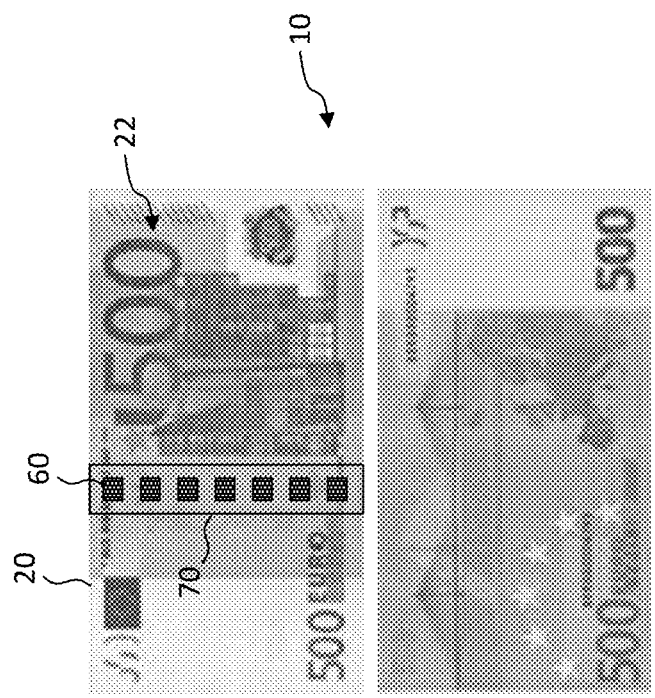
FIG. 4 is a plan view of the front and back sides of another embodiment of the present invention.

The substrate 62 of the light-emitting module 60 can be at least one of glass, plastic, polymer, resin, silicon, a semiconductor, and a compound semiconductor, or other suitable substrates. Any one or all of the optional acoustic wave filter 52, light emitter 30, and electronic circuit 40 can be assembled on the substrate 62 using micro-transfer printing and electrically interconnected with electrically conductive wires 64 using photolithographic methods and materials to form the light-emitting module 60. The light-emitting module 60, with its various components including the substrate 62, can, in turn be micro-transfer printed or otherwise printed, transferred, or assembled onto another substrate such as the banknote 20 to form the hybrid banknote 10 or on to an intermediate substrate such as a tape or reel for high-speed printing onto a sheet or web, such as a sheet or web of banknotes 20 or flexible substrates incorporated into banknotes 20. Referring to FIG. 4, in an embodiment of the invention, the banknote 20 includes a flexible substrate, ribbon, film, or thread (all of which are indicated as ribbon 70 herein) incorporated in, laminated to, woven into, or hot-press mounted onto the banknote 20. The one or more independent light-emitting modules 60 are mounted on, embedded in, or micro-transfer printed onto the flexible substrate, ribbon 70, film, or thread. The flexible substrate, ribbon 70, film, or thread can include paper, plastic, impregnated paper, or metal foil and can be electrically insulating.

In another embodiment of the present invention, the hybrid banknote 10 includes a plurality of light-emitting modules 60 and there is no electrical interconnection between the various light-emitting modules 60 so that each light-emitting module 60 is electrically separate, independent, and disconnected. Each light-emitting module 60 is electrically independent of all of the other light-emitting modules 60 and, other than, in one embodiment, having a common substrate 62 or being mounted on a common ribbon 70 or banknote 20, can also be spatially separated and physically independent and separated, although the light-emitting modules 60 can be arranged in a desired pattern. The light-emitting modules 60 can each have a separate substrate 62 (FIG. 12) different from the banknote 20. The light-emitting modules 60 can be disposed to form at least one of a character, a graphic indicator, an icon, a number, a letter, and a pictogram or indicates a value, a date, or a person. The graphic indicator can have semantic content, for example indicating a value, a date, or a person. For example, in FIG. 4, the light-emitting modules 60 form a line. The banknote 20 can be a government-issued banknote 20 or other high-security document having visible markings 22 and the one or more light-emitting modules 60 can be disposed in a location corresponding to a portion of the visible markings 22 to highlight or otherwise indicate the portion of the visible markings 22. For example, the light emitter 30 can underline or surround a graphic element of the visible markings 22. As shown in FIG. 1, the light-emitting modules 60 form the number 500, which matches the visible marking 22 printed on the banknote 20.

Figure 5:
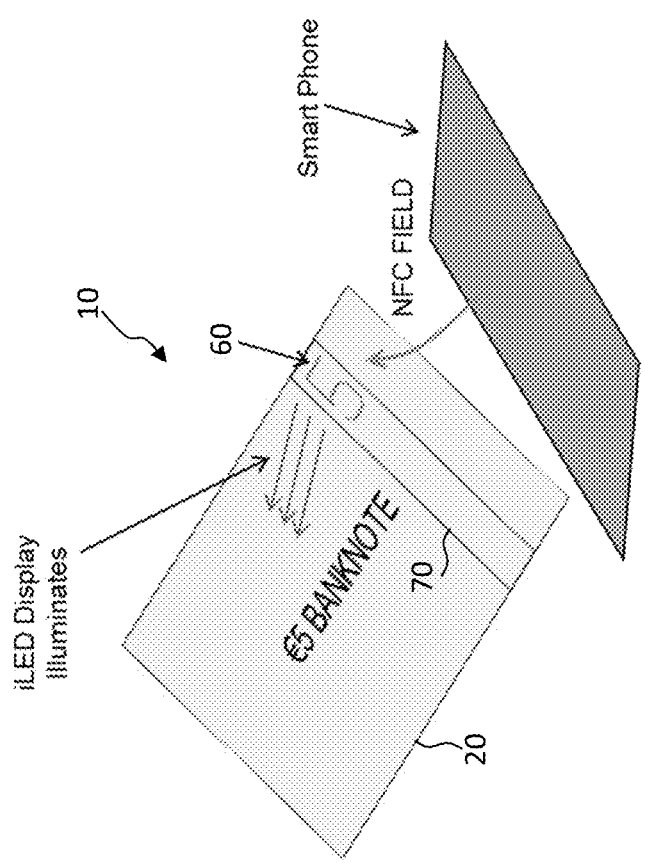
FIG. 5 is a schematic illustration of operating an embodiment of the present invention.

Referring to FIG. 5, in an example embodiment, the banknote is a banknote 20 having a denomination (e.g., five) and the light-emitting modules 60 are disposed to form the numeral 5 on the ribbon 70 laminated onto or woven into the banknote 20 making the hybrid banknote 10. When the hybrid banknote 10 is placed near a near-field-communication field, for example a near-field-communication field generated by a smartphone or other NFC device, the antenna 50 of each light-emitting module 60 will generate electrical power, optionally voltage amplified and filtered by the acoustic wave filter 52 (FIG. 2), to the electronic circuit 40 to cause the light emitter 30 to emit light. Because the signal harvested from the antenna 50 is relatively small, it is helpful to have as long an antenna 50 extending with as many turns as possible in the light-emitting module 60 to provide enough power to light the light emitters 30. Because the light-emitting module 62 can be small and the antenna 50 needs to have a length matched to the frequency of the received signals, it can be necessary to have a large number of antenna turns. In an embodiment, the necessary number of turns are provided in a single layer; in another embodiment, multiple layers of antenna turns are provided. The signal received typically has a relatively smaller voltage and larger current. Thus, in an embodiment, the acoustic wave filter 52 is also a power converter 52 that converts the received signal to a signal with a relatively larger voltage and smaller current more suitable for providing power to the electronic circuit 40 and for lighting the light emitter 30. In a further embodiment of the present invention, the acoustic waver filter 52 is smaller than conventional acoustic waver filters, for example having an area less than 100, 50, 20, or 10 square microns suitable for micro-transfer printing and unsuitable for conventional transfer or printing methods and having a reduced number of acoustic resonant filter modes, for example a single dominant resonant mode. Although the light-emitting modules 60 are electrically separate and independent, the NFC field will provide power to all of the light-emitting modules 60 at about the same time so that the light emitters 30 will emit light visibly simultaneously, in this case forming a visible numeral 5.

Figure 7:
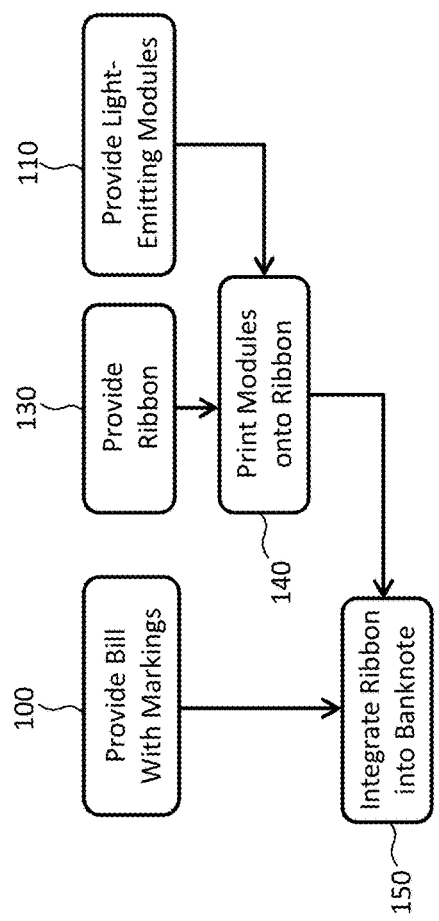
FIGS. 6-7 are flow charts illustrating methods of the present invention.
Figure 6:
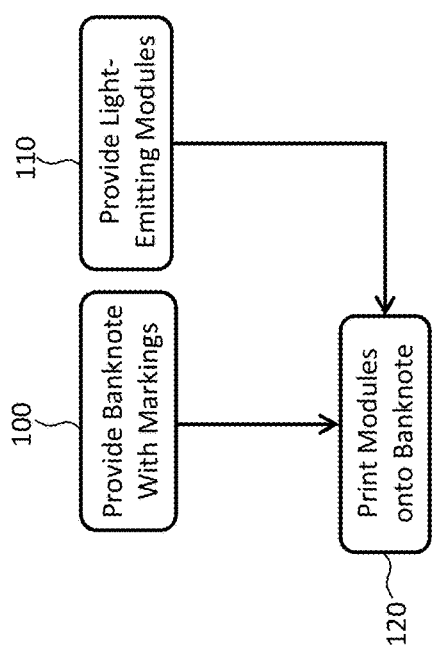
Figure 8:
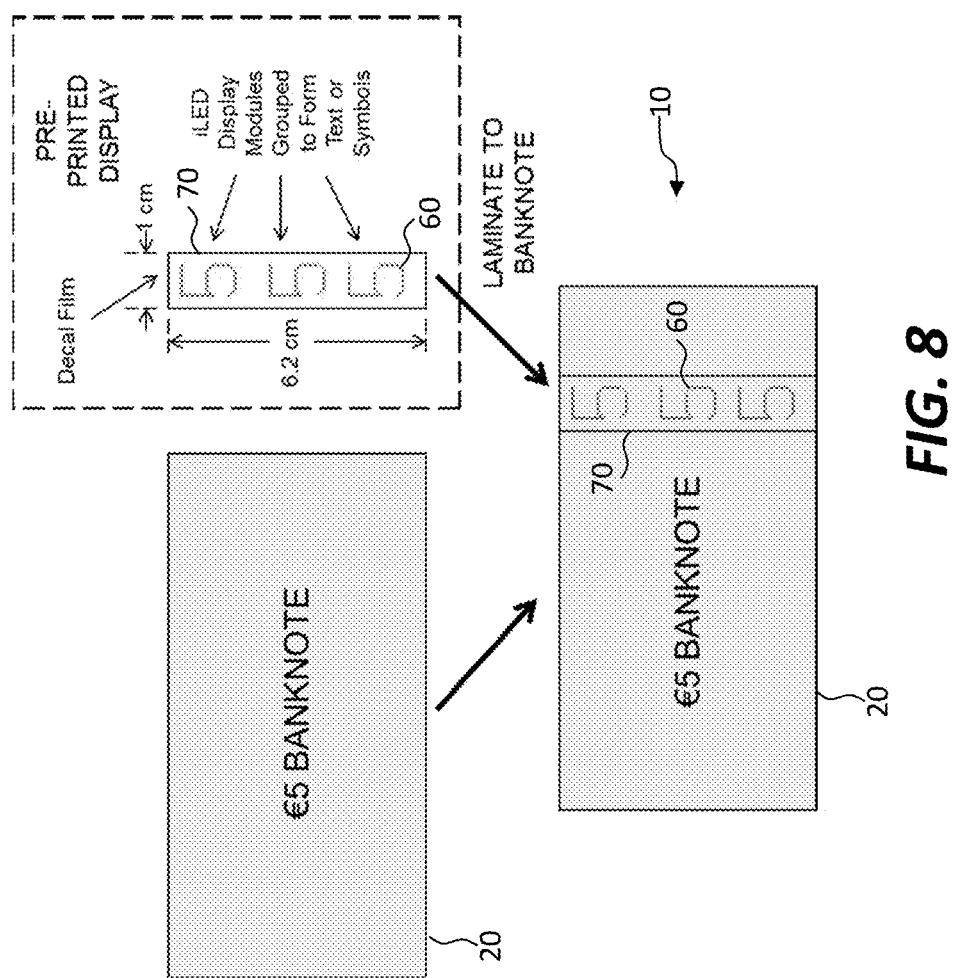
FIG. 8 is a schematic diagram illustrating a method of making an embodiment of the present invention.

Referring to FIG. 6, in an embodiment of the present invention, a banknote 20 is provided in step 100, for example using conventional currency materials and printing technologies, and a light-emitting module source wafer (e.g., source wafer 36, FIG. 3) is provided in step 110, for example using photolithographic materials and techniques. Alternatively, the light-emitting modules 60 are provided in surface-mount accessible form, or on a tape or film. The light-emitting modules 60 are printed from the light-emitting module source wafer 36 or other source to the banknote 20 in step 120 to form the hybrid banknote 10. Alternatively, referring to both FIG. 7 and FIG. 8, a banknote 20 is provided in step 100, for example using conventional currency materials and printing technologies, and a light-emitting module source is provided in step 110. A ribbon 70 is provided in step 130 and the light-emitting modules 60 are printed or otherwise disposed onto the ribbon 70 in step 140, for example by micro-transfer printing, by surface mount techniques, or from a tape and reel. The ribbon 70, with the light-emitting modules 60, is then integrated into the banknote 20 in step 150 to form the hybrid banknote 10 for example by lamination or hot-pressing. This process has the advantage of more-readily controlling the substrate (ribbon 70) on which the light-emitting modules 60 are micro-transfer printed and using conventional methods for integrating the ribbon 70 into the banknote 20.

In an embodiment, the one or more light-emitting modules 60 include different inorganic light-emitting diodes 32 that emit different colors of light, for example red, green, and blue light. The different light-emitting modules 60 can be disposed in groups for a desired effect, for example each numeral or graphic element in the disposed arrangement of light-emitting modules 60 can have a different color. In an embodiment, the electronic circuit 40 controls the light emitters in a light-emitting module 60 to flash once or to flash sequentially.

Figure 9B:
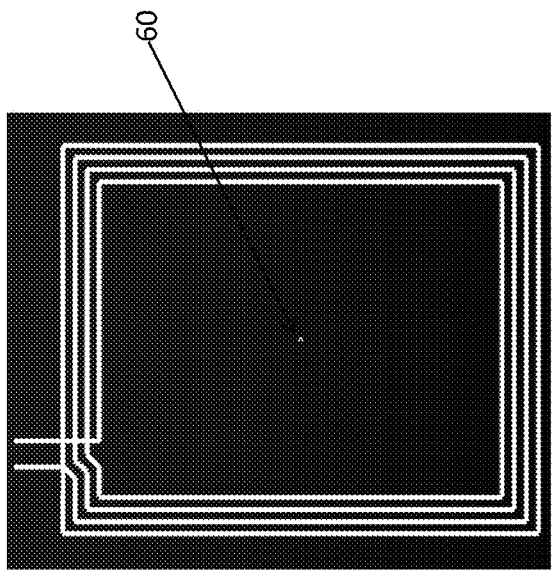
FIGS. 9A and 9B are schematic illustrations of antennae according to embodiments of the present invention.
Figure 9A:
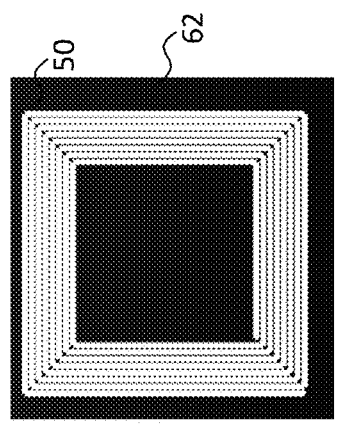

FIG. 9A illustrates a receiving antenna 50 with multiple turns (windings, or coils) on the substrate 62 for a light-emitting module 60. FIG. 9B shows a typical NFC reader antenna 50 found in a smart cellular telephone or other NFC device. FIG. 9B illustrates the approximate size of the light-emitting module 60 relative to the size of the NFC reader antenna (FIG. 9A). As is apparent from the illustration, the physical size of the light-emitting module 60 is very small relative to the NFC reader antenna.

Figure 10:
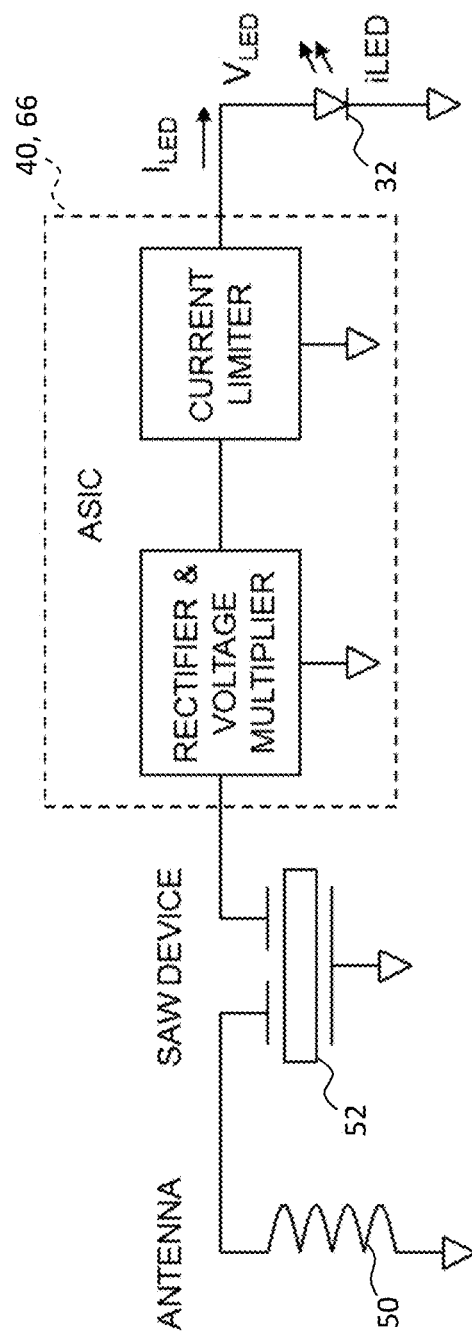
FIG. 10 is a schematic diagram illustrating a circuit according to an embodiment of the present invention.

FIG. 10 is a schematic illustrating in more detail the electronic circuit 40. The antenna 50 is electrically connected to the input of the acoustic wave filter 52 which filters and impedance converts the electrical signal from the antenna 50. The antenna 50 converts an externally generated NFC magnetic field into electrical power and the acoustic wave filter 52 is tuned to the desired electrical signal from the antenna 50 and multiplies the received electrical signal to a voltage sufficient to operate the electronic circuit 40. The output of the acoustic wave filter 52 is electrically connected to the electronic circuit 40, in this case including a rectifier and voltage multiplier that provides electrical current and a sufficient voltage through a current limiter to cause the inorganic light-emitting diode 32 to emit light. For example, the electronic circuit 40 can rectify a 13.56 MHz radio frequency signal into DC voltage, increases the voltage further, for example with a voltage doubling circuit, and regulates the current to the iLED 32. The electronic circuit

40 can be a small integrated circuit such as a chiplet or, as shown, an application specific integrated circuit 66.

The acoustic wave filter 52 is operated at a dimension of one-half wavelength and is used to implement an impedance transformer similar to that using ordinary electrical transmission lines. The acoustic wave filter 52 can operate at much smaller dimensions than electrical transmission lines utilizing only metallic conductors and typical dielectric mediums. The acoustic velocity of the acoustic wave filter 52 is only on the order of 3000 to 6000 meters per second and can therefore implement a half-wave transmission line in a distance of 0.5 mm or less for a given NFC frequency such as 13.56 MHz with a quality factor (Q) on the order of 1000 or more. The half-wave element may be acoustically grounded at two ends and driven near one end by the very low impedance antenna 50. A high impedance output is available at the center of the acoustic wave filter 52. The output voltage of antenna 50 is on the order of a few millivolts which is insufficient to power the electronic circuit 40. The acoustic wave filter 52 converts the low antenna 50 voltage via the half-wave transmission line and its associated high Q to a much higher output voltage of 0.5 volt or greater which is sufficient to energize the electronic circuit 40.

Figure 11B:
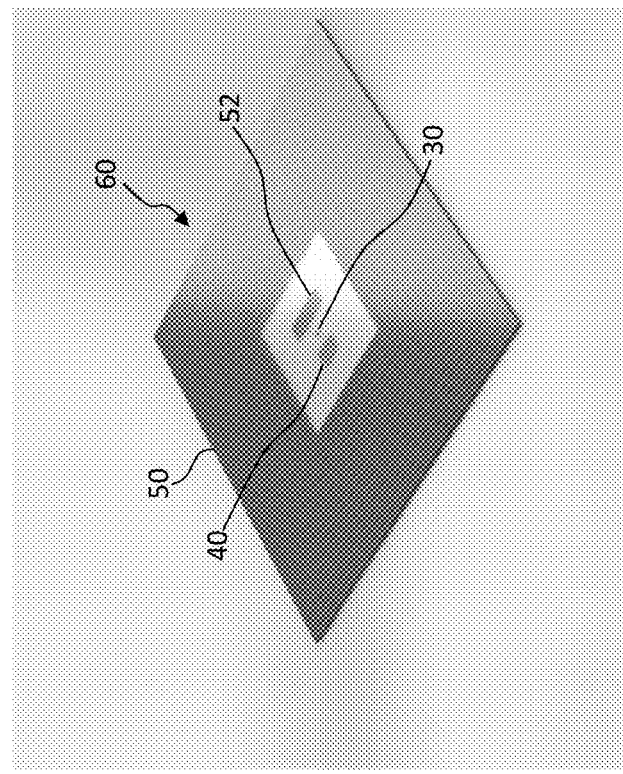
FIG. 11A is a perspective according to an embodiment of the present invention and FIG. 11B is a corresponding, less-detailed and more accurate perspective at a larger scale.
Figure 11A:
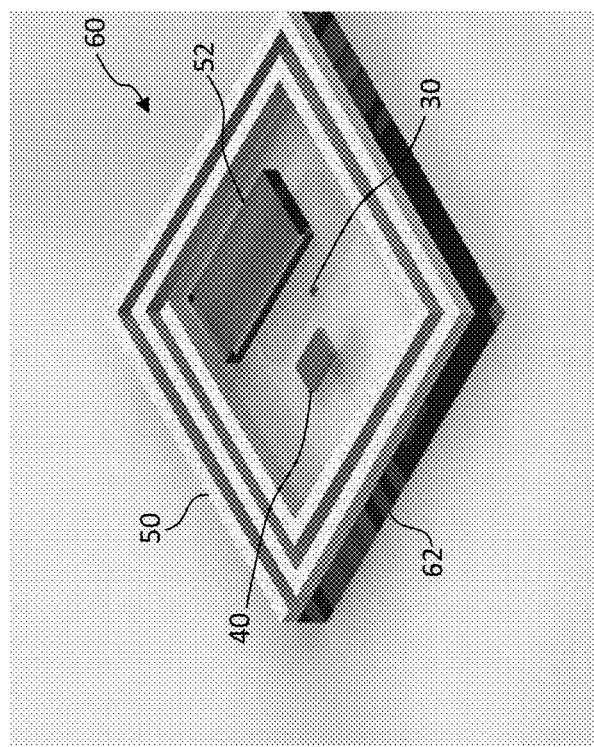

FIGS. 11A and 11B are perspectives illustrating the antenna 50, electronic circuit 40, acoustic wave filter 52 and light emitter 30 disposed on the substrate 62 to make up the light-emitting module 60. For example, the light-emitting module 60 structure of FIGS. 11A and 11B can have a length and a width less than 0.5 mm and a height less than 25 microns. Because the light-emitting module 60 structure is relatively small and does not require any external electrical connections, it is very robust under mechanical stress, for example when folded, spindled, or crumpled. The banknote 20 tends to be more flexible than the light-emitting module 60 (although the elements and substrate 62 of the light-emitting module 60 can be somewhat flexible) and will preferentially flex, reducing the stress on the light-emitting modules 60.

Figure 12:
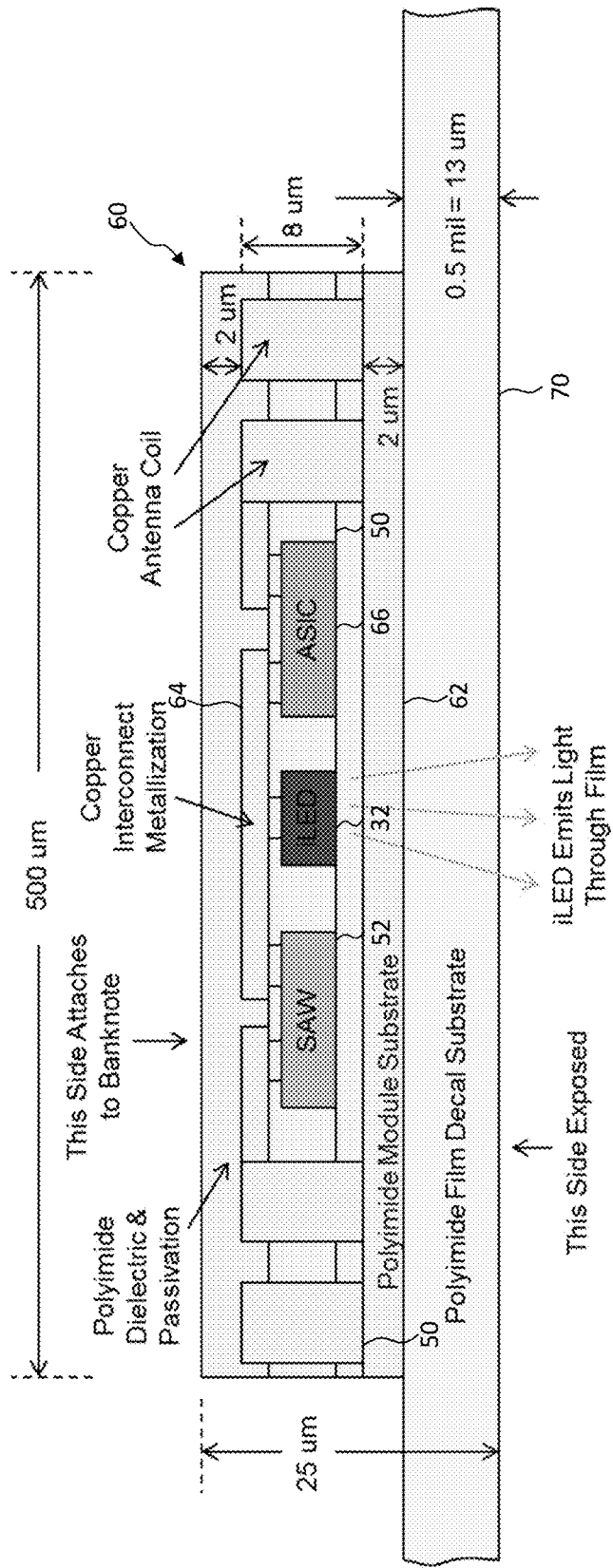
FIG. 12 is a cross section of an embodiment of the present invention.

FIG. 12 illustrates an embodiment of the present invention in cross section. As shown in FIG. 12, the light-emitting module 60 is disposed on a ribbon 70 that is laminated to the banknote 20 (not shown) with the light-emitting module 60 between the ribbon 70 and the banknote 20. The iLED 32 emits light through the ribbon 70 so the ribbon 70 must be at least partially transparent to the frequency of emitted light, for example 50%, 60%, 70%, 80%, 90%, or 95% transparent. This construction protects the light-emitting module 60 from environmental or mechanical damage. Such a module can be assembled using compound micro-assembly techniques. For example, a glass wafer is provided with a patterned sacrificial layer and a substrate layer to form the substrate 62. The iLED 32, an integrated circuit incorporating the electronic circuit 40, and the acoustic wave filter 52 are each micro-transfer printed from individual different source wafers to the glass wafer (substrate 62). Using photolithographic techniques, electrically conductive wires 64 are patterned over the components and the glass wafer, for example by evaporating or sputtering an aluminum metallization layer and pattern-wise etching (using optically sensitive photoresist and optical masks) the metal layer to form the antenna 50 and wires 64. A dielectric is deposited, for example silicon dioxide using sputtering or evaporation, or by coating or laminating a layer of a dielectric material such as SU8. The process can be repeated multiple times to make a multi-layer antenna 50 with an increased number of turns. Electrical connections (wires 64) can be formed by etching vias and patterning deposited metal in the vias. A passivation layer can be provided for environmental protection. The substrate 62 and the components can have a thickness of only a few microns and the completed structure can have a thickness of less than 35 μm. The light-emitting modules 60 can be formed over a patterned sacrificial layer for micro-transfer printing. The patterned sacrificial layer is etched to form the tethers 34 and the micro-transfer printable light-emitting modules 60 (as in FIG. 3). A stamp is pressed against the light-emitting modules 60, fractures the tether 34, and transfers the light-emitting modules 60 to a destination substrate such as the ribbon 70 (step 140 of FIG. 7).

Figure 19:
FIG. 19 is a flow chart illustrating a method of the present invention.

Referring to FIG. 19 in more detail, the light emitter 30 (e.g., an iLED), the acoustic wave filter 52, and the ASIC 66 can be formed in different materials for example AlN for the acoustic wave filter 52, a compound semiconductor such as GaAs or InGaN for the light emitter 30 (e.g., an iLED), and silicon for the ASIC 66. A source wafer (e.g., iLED source wafer 36) for each of these devices in a suitable material is formed in steps 300, 310, and 320, respectively. An intermediate substrate (e.g., substrate 62) is provided and the light emitters 30, the acoustic wave filter 52, and the ASIC 66 are each micro-transfer printed onto the substrate 62 in steps 330, 340, and 350, respectively, but can be transferred in any desired order. If any or all of the devices are micro-transfer printed, each will include a fractured tether 34 (FIG. 3). Alternatively, other transfer methods can be used. After the devices are all transferred to the substrate 62, electrical connections can be formed, for example using photolithographic methods to form electrical connections such as wires 64, in step 360, as well as the antenna 50.

Figure 20:
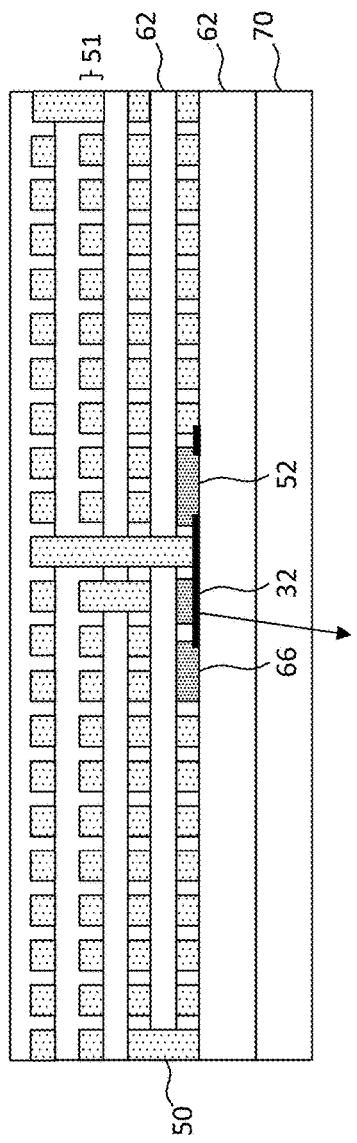
FIGS. 20 and 21 are cross sections illustrating arrangements of the antenna and integrated circuits of the present invention.
Figure 21:
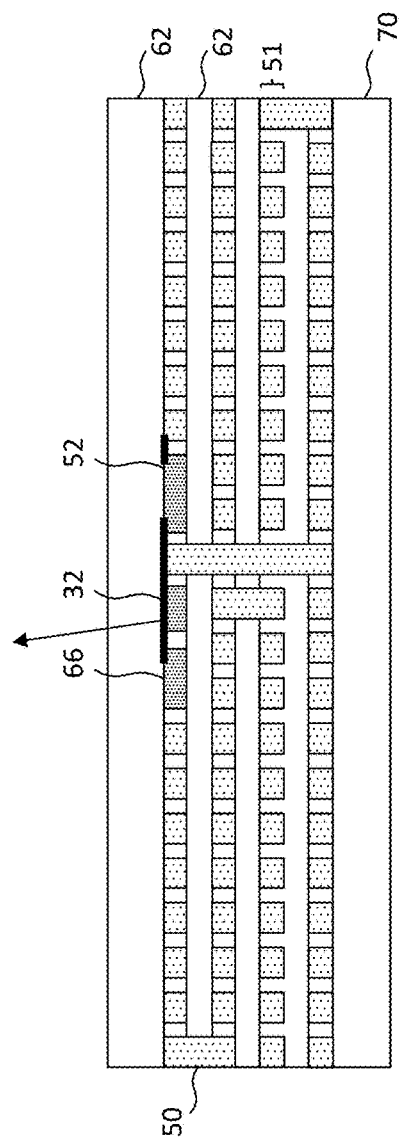

Referring to FIGS. 20 and 21, in further embodiments of the present invention, the antenna 50 is a multi-layer antenna. Since the signal captured by the antenna 50 is partly dependent on the number of turns, or coils or windings, in the antenna 50, it can be useful to increase the number of such turns to increase the signal magnitude. In the simplified illustration of FIG. 20, multiple layers 51 of antenna turns are separated by dielectric layers 54 with each antenna layer 51 connected to an adjoining antenna layer 51, for example through a via (not shown). In an embodiment, adjoining antenna layers 51 are connected alternately near the edge and near the center of the antenna 50, thus reducing the number of layers and vias needed. In an embodiment, the number of layers 51 in the multi-layer antenna 50 is even, as shown in FIGS. 20 and 21 so that each end of the loop antenna 50 can be electrically connected to the electronic circuit 40, forming a loop antenna 50 or providing a relative ground for the electronic circuit 40. The electrical connections to the electronic circuit 40 from the antenna 50 can be at or near the center of the substrate 62, as shown. Thus, in an embodiment, the antenna layers 51 are alternately connected near the edge of the antenna 50 and near the center of the antenna 50, where the center of the antenna 50 is near the center of the spiral formed by the turns of the electrical conductor forming the antenna 50. Moreover, in an embodiment the antenna layer 51 farthest from the electronic circuit 40 is electrically connected to the electronic circuit layer nearer the center of the antenna layer 51 than the edge of the antenna layer 51. The dielectric layers 54 keep the various layers 51 of antenna turns from electrically shorting together or electrically shorting to the light emitters 30, the acoustic wave filter 52, the ASIC 66, or the wires 64 (collectively devices, the wires 64 are not shown in FIGS. 20, 21). The dielectric layers 54 can be formed by coating, embossing, and filling, e.g., with curable conductive ink, photolithographic deposition and patterning, or laminating subsequent layers of materials, for example a curable resin or other plastic layer and can encapsulate the electrical conductor making up the antenna 50. A laminated layer can include an antenna layer 51. The vias between and connecting layers 51 can be formed with photolithography or can be a part of the layer applied.

In the embodiment of FIG. 20, the devices are formed or disposed on the substrate 62 and the layers 51 of antenna turns are formed in the same layer and above the devices so that the electronic circuit 40 is located between the antenna portion and the banknote 20 and at least a portion of the antenna 50 is located on a side of the electronic circuit 40 opposite the banknote 20. In a particular embodiment, the devices are directly beneath (or above) one or more of the antenna turns, reducing the area of the light-emitting modules 60. The substrate 62 is then disposed on or adhered to the ribbon 70 in step 370, for example by micro-transfer printing, or by other means, so that the light emitters 30 emit light through the ribbon 70. In the embodiment of FIG. 21, the same process can be used to make the multi-layer antenna 50 and device structure, but the top antenna 50 layer is disposed or adhered to the ribbon 70, so that the light emitters 30 emit light in a direction opposite the ribbon 70. In this case, a portion of the antenna 50 is located between the integrated circuit 66 and the banknote 20 (ribbon 70). In step 380, the ribbon 70 is incorporated into a banknote 20.

A plurality of substrates 62 can each be provided and the light-emitting module 60 made individually on each substrate 62. In a more efficient process, the substrate 62 is originally much larger than the light-emitting module 60 and multiple light-emitting modules 60 are formed on a common substrate 62 at the same time using the same process steps, such as micro-transfer printing, photolithographic steps, and coating. The substrate 62 can then be diced, for example by scribing and breaking, diamond saw cutting, or laser cutting, to form the individual light-emitting modules 60, such as surface-mount devices. However, it is an advantage of the present invention that very small light-emitting modules 60 can be formed so that conventional methods of separating individual light-emitting modules 60 or disposing light-emitting modules 60 onto a ribbon 70 can be difficult. Therefore, in an embodiment of the present invention, the light-emitting modules 60 are micro-transfer printable light-emitting modules 60 formed over sacrificial portions of a sacrificial layer and fastened with tethers 34 to anchors on the substrate 62. The individual light-emitting modules 60 are then disposed on the ribbons 70 using micro-transfer printing stamps to contact the light-emitting modules 60, the tethers 34 are fractured, the light-emitting modules 60 are transferred to the ribbon 70, the light-emitting modules 60 are applied to the ribbon 70 to adhere them to the ribbon 70 (for example on an adhesive layer on the ribbon 70), and the stamp is removed.

In the case in which the substrates 62 are diced to provide individual light-emitting modules 60, the devices can be disposed on the substrates 62 using micro-transfer printing. In this case, to reduce the number of print steps, it is useful to provide a substrate 62 whose size is on the order of the source wafer 36 size so that many devices from each source wafer 36 can be transferred in a single stamp transfer step. However, in an embodiment in which the light-emitting modules 60 are also micro-transfer printed (rather than just the devices from the source substrate 36), it is useful to provide a substrate 62 whose size is on the order of a web of ribbons 70 that are destination substrates for the micro-transfer process. For example, if the ribbons 70 are 2 mm in width and it is desired to micro-transfer print five hundred light-emitting modules 60 at a time, a web of ribbons 70 can be one meter in width and the substrate 62 can be a similar size, thereby reducing the number of micro-transfer printing steps necessary to dispose a light-emitting module 60 on each ribbon 70.

In other embodiments of the present invention, one or more light emitters 30, an integrated circuit 66 or, optionally, an acoustic wave filter 52 are micro-transfer printed onto a substrate 62 to form a light-emitting module 60 and the light-emitting modules 60 incorporate the substrate 62. In a further embodiment, a plurality of the one or more light emitters 30, integrated circuits 66 or optional acoustic wave filters 52 are micro-transfer printed onto the substrate 62 to form light-emitting modules 60. The light-emitting modules 60 are, in turn, micro-transfer printed onto the banknote 20 or onto a flexible substrate, film, thread, or ribbon 70 subsequently incorporated in, laminated to, or woven into the banknote 20. A plurality of the light-emitting modules 60 can be micro-transfer printed from the substrate 62 onto a plurality of the banknotes 20 or onto one or more of flexible substrates (e.g., ribbon 70) in a single step, for example in a web and a roll-to-roll process. In an embodiment, the substrate 62 has an area or dimension that is equal to or larger than a corresponding area or dimension of the documents 20, e.g., banknotes 20 or flexible substrates, e.g. ribbons 70. For example, if the ribbons 70 or banknotes 20 are provided in a web, the substrate 62 can have a width or length dimension that is at least as large as the width of the web. The substrate 62 can have an extent (for example an x or y dimension, length or width, but not a thickness or z dimension) or area that is within a range of one tenth to ten times an extent or area of the flexible substrate (for example a width of a web), within a range of one quarter to four times an extent or area of the flexible substrate, within a range of one half to two times an extent or area of the flexible substrate, or within 25%, 10%, or 5% of an extent or area of the flexible substrate. By providing a substrate 62 having a size that is the same order of magnitude, comparable, or larger than the destination substrate of the micro-transfer printing step, the number of separate print steps can be reduced since each print step can transfer more light-emitting modules 60.

Figure 13:
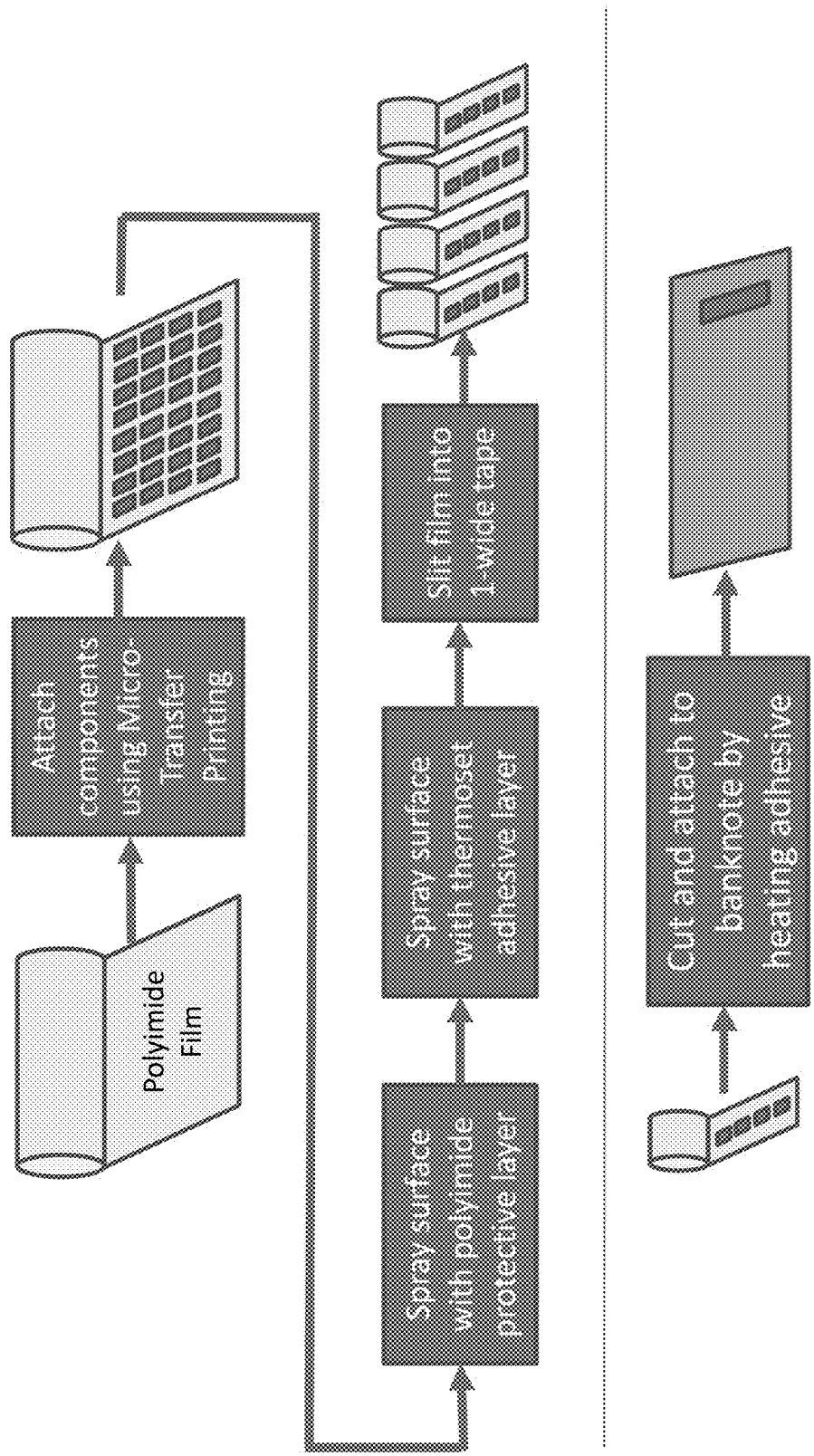
FIG. 13 is a flow graph illustrating a method of the present invention.

Referring to FIG. 13, in an embodiment of the present invention, a hybrid banknote 10 according to the structure of FIG. 12 can be constructed by first providing a roll of polyimide film (1302). The light-emitting modules 60 are micro-transfer printed onto separated portions of the polyimide layer (1304), which acts as the ribbon 70. Alternatively, the different components of the light-emitting module 60 are micro-transfer printed onto the roll of polyimide film itself and processed photolithographically to complete the light-emitting modules 60 so that the polyimide film serves as the substrate 62 (not shown) and can be a common substrate for multiple light-emitting modules 60. The roll of polyimide file is sprayed with a protective layer (1306) and a thermoset adhesive layer (1308) and slit into strips (1310). Each strip is then cut into portions suitable for each banknote 20, applied to the banknote 20, and heated to complete the hybrid banknote 10 (1312).

In the present invention, it is important that the antenna 50 provide sufficient power to the electronic circuit 40 to cause the light emitter 30 to emit light. FIG. 14 is a table presenting various design choices to enable a corresponding variety of functional embodiments of the present invention. Table 14 provides example antenna 50 dimensions based on the power required by an iLED 32 load. As shown, small antennas 50 suitable for small light-emitting modules 60 generate small output voltages that can be increased using acoustic wave filters 52 operating in a resonance condition. An increased voltage of 0.5 V is sufficient to be converted with a charge pump in the electronic circuit 40 to drive an iLED 32 at 0.3 µA at 3.3 V.

The light-emitting module 60 structure of the present invention disposed on the banknote 20 can be generally employed in multi-element light-emitting systems. For example, in an embodiment of the present invention, a multi-element light-emitting system comprises a plurality of independent light-emitting modules 60, each independent light-emitting module 60 including an antenna 50 with multiple turns, an electronic circuit 40, and a light emitter 30 mounted and electrically connected on a separate substrate 62. The independent light-emitting modules 60 are disposed in a pattern to form a visible indicator and can be disposed on a variety of underlying structures including, but not limited to, banknotes 20.

Figure 15:
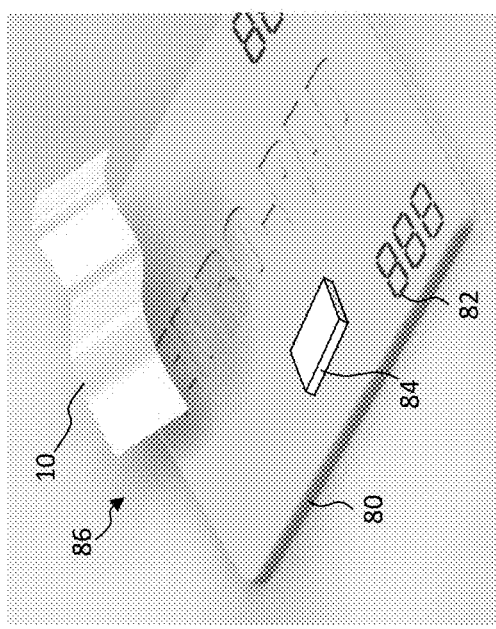
FIG. 15 is a perspective according to an embodiment of the present invention.
Figure 16:
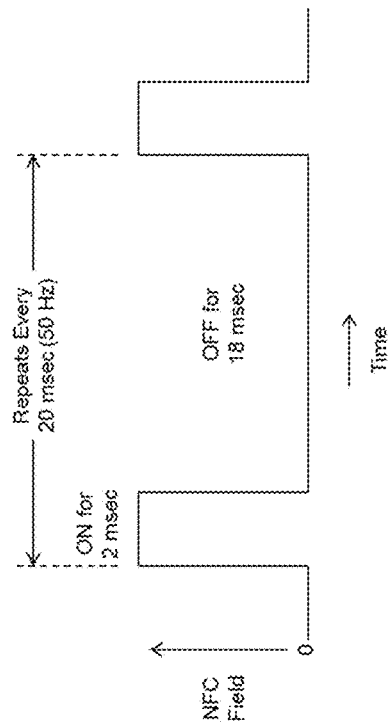
FIG. 16 is a timing diagram according to an embodiment of the present invention.

The light-emitting modules 60 of the present invention emit light when the light-emitting modules 60 are located in an NFC magnetic field. Referring to FIG. 15, such a field can be provided by a hybrid banknote mat 80, comprising a mat circuit 84 and an antenna 50 (not shown but similar to those found in existing NFC terminals or smart phones, e.g., FIG. 9B). Although illustrated as a largely planar mat, the form factor of the mat 80 is not limited to any specific form factor and can be similar in structure to any NFC reader/writer. The mat circuit 84 provides a continuous or pulsed NFC signal, the pulsed NFC signal having a pulse rate of ten, twenty, fifty, or one hundred pulses per second or greater. This pulse rate is much higher than those found in conventional NFC terminals or smart phones so that the light-emitting modules 60 of the present invention will emit light at a sufficient frequency as to be visible to the human eye. As illustrated in FIG. 16, the NFC field can operate for 2 msec out of every 20 msec and a 50 Hz frequency. Each such NFC circuit can drive thousands of light-emitting modules 60 to emit light, enabling a wide variety of patterns, applications, and effects. The mat 80 can include a display 82 responsive to the mat circuit 84. The hybrid banknote 10 of the present invention can also be interacted with by conventional NFC devices.

In a further embodiment of the present invention, the electronic circuit 40 stores information in the memory 44, for example serial number information, value information, manufacturing information, usage information, or location information. This information can be retrieved using RFID or NFC techniques and read, for example by the mat 80 and the information, or an aggregation of the information, displayed on the mat 80 with the the display 82. For example, the mat display 82 can display the sum of the values of the hybrid banknotes 10 located on or very near the mat 80. The mat 80 can also include switches, buttons, or other user-interactive devices for controlling the mat 80 to perform various desired functions or select options. For example, options can include displaying value, serial number, or manufacturing date, location of the hybrid banknote 10. Information can be encrypted, can be changed (if the memory 44 includes writable or rewritable memory). Thus, in an embodiment, a device, for example the mat 80, can write information into the electronic circuit. The information can also be communicated to and stored in an information registry independent of the hybrid high-security document 10 or banknote 20. If the information is a value, the banknote 20 can then have the stored value rather than a denomination printed on the banknote 20.

The mat 80 can be a part of a cash register or management system and can detect the value and serial identification of the hybrid banknotes 10 in the system to provide a currency inventory. Such a cash register system can provide security and theft detection. Hybrid banknotes 10 that have missing or non-functional light-emitting modules 60 can be detected by comparing the number of detected light-emitting modules 60 to the expected number of light-emitting modules 60. A hybrid banknote 10 can even be deactivated or the light-emitting modules 60 can be placed in a deactivated state.

In further embodiment of the present invention and as illustrated in FIG. 17, a method of using a hybrid banknote 10 comprises the steps of providing a hybrid banknote 10 in step 200, exposing the hybrid banknote 10 to an electromagnetic field so that the antenna 50 provides power to the electronic circuit 40 and causes the light emitter 30 to emit light in step 210, and observing or detecting the light in step 220. In an alternative embodiment and as shown in FIG. 18, the electromagnetic field is provided by the mat 80 in step 215, the electronic circuit 40 stores information, for example in the memory 44, the information is read from the hybrid banknote 10 in step 217, and the display 82 is responsive to the information. Alternatively, the information from the hybrid banknote 10 is transferred to a computer system for action or processing in step 230. Information can also be written into a hybrid banknote 10.

The electronic circuit 40 can also be an integrated circuit, for example a small chiplet, suitable for micro-transfer printing. The electronic circuit 40 can include digital circuits or logic (for example CMOS circuits) and power circuits (for example for driving an LED). The electronic circuit 40 can include information storage circuits, a state machine, or a stored program machine to implement the desired functionality of the hybrid banknote 10. The electronic circuit 40 can read or write information such as currency values, process information, respond to input and provide output.

In a further embodiment, the iLEDs 32 and electronic circuit 40 are too small to be readily visible with the unaided human eye. Furthermore, the iLEDs 32 and electronic circuit 40 can be located in areas of the banknote 20 that include visible markings 22 to further obscure the presence of the iLEDs 32 and electronic circuit 40, as well as any wires 64. In one embodiment, any of the iLEDs 32, electronic circuit 40, or wires 64 are marked with visible markings 22. For example, ink can be printed over the non-emitting side of the iLEDs 32, electronic circuit 40, or wires 64 to obscure them or otherwise make them a part of the visible markings 22 on the banknote 20. Since the iLEDs 32, electronic circuit 40, or wires 64 can each be very small, for example having a size in the micron range, they can be effectively invisible to the unaided human eye. For example, the one or more inorganic micro light-emitting diodes 32 or the electronic circuit 40 of the hybrid banknote 10 can have a width from 2 to 5 µm, 5 to 10 µm, 10 to 20 µm, or 20 to 50 µm, a length from 2 to 5 µm, 5 to 10 µm, 10 to 20 µm, or 20 to 50 µm, or a height from 2 to 5 µm, 4 to 10 µm, 10 to 20 µm, or 20 to 50 µm.

In another embodiment of the present invention, the hybrid banknote 10 includes visible markings 22 that do not include a value. Such a hybrid banknote 10 can be a non-denominational banknote 20 that either has an assigned value or a variable value stored in a memory 44 in the electronic circuit 40. The memory 44 can be a read-only memory that encodes a desired assigned value. The assigned value can be a currency value or can include an electronic serial number, or both.

In the case in which the assigned value is variable, the memory 44 can be a write-once memory 44 that stores multiple values in memory locations that are ordered in a sequential order, for example by memory address. The write-once memory 44 can, for example, employ fuses that are electrically destroyed and cannot be rewritten. Alternatively, the memory 44 can be a non-volatile read-write memory. In this case, the value stored by the hybrid banknote 10 can change over time. The current value can be modified by, for example, a teller machine. If a change in the current value of the hybrid banknote 10 is desired, an input value can be input by a user with an input device. A teller machine controller can then calculate or otherwise determine a new stored value responsive to the input value and store the new value in the hybrid banknote 10, for example by communicating the new stored value to the electronic circuit 40 which then writes the new stored value in the memory 44. In an embodiment, the electronic circuit 40 only writes new stored values in the memory 44 that are smaller than the current value. In another embodiment, the electronic circuit 40 can write new stored values in the memory 44 that are larger than the current value, or that are larger than the current value but are limited to a maximum value. The change in current value of the hybrid banknote 10 can represent or be the result of a financial transaction, for example a purchase or a financial exchange with or facilitated by a financial institution such as a bank or government institution such as a central bank. Read-only memories, write-once memories, and read/write memories together with controllers and read/write circuitry can be formed in integrated circuits and electrical circuits. Devices for currency handling, optical inspection, displays, input devices (such as keyboards or touch screens) can be made using electromechanical, electronic, and optical technologies.

An assigned or current value can be programmed into the electronic circuit 40 or an associated memory 44 (also micro-transfer printed if it is a separate integrated circuit or chiplet) either before or after the electronic circuit 40 or memory 44 is micro-transfer printed. Alternatively, an external device such as a hybrid banknote teller machine (that can be a part of or include, for example, a mat 80) can communicate with the electronic circuit 40 to write an assigned or current value to the hybrid banknote 10. A hybrid banknote 10 teller machine can also communicate with a central or remote database to establish the legitimacy of the hybrid banknote 10, track its use or location, or approve a transaction and record or approve the transaction. The communication can include an electronic serial number.

In further embodiments of the present invention, the light-emitting modules 60 of the hybrid high-security document 10 are wirelessly powered displays 60. The wirelessly powered display 60 comprises a substrate 62. One or more light-emitters 30 (e.g., inorganic light-emitting diodes 32) can form one or more pixels in the wirelessly powered display 60. An antenna with multiple turns and an electronic circuit are also disposed on the substrate. The electronic circuit is electrically connected to the one or more inorganic LEDs and the antenna, the antenna is responsive to electromagnetic energy to provide electrical power to the wirelessly powered display 60, and the electronic circuit 40 includes a power converter 52 that converts a signal with a relatively high current and low voltage to a signal with a relatively high voltage and low current. In an embodiment of the present invention, the wirelessly powered display 60 excludes a battery, internal power source, or wired power source and the wirelessly powered display 60 operates solely on the electrical power provided through the antenna 50.

In one configuration of the present invention, a plurality of light-emitting modules form a single wirelessly powered display 60. In another embodiment, each light-emitting module 60 forms a single wirelessly powered display 60. In yet another embodiment, a plurality of light-emitting modules are provided on a common substrate 62 and comprise one or a plurality of wirelessly powered displays 60. Thus, in one embodiment, each of the light-emitting modules 60 in FIG. 1 is a separate wirelessly powered display 60. In an alternative configuration, the light-emitting modules 60 of FIG. 1 form a single wirelessly powered display 60. The light-emitting modules 60 can each have a separate substrate 62 or are provided on a common substrate 62.

The converted signal can provide power to the light-emitters 30 of the pixels and to a display controller 46 that controls the light-emitters 30. The display controller 46 can be a portion of the electronic circuit 40 (FIG. 2). In an embodiment, the wirelessly powered display 60 displays a fixed image, that is, when wireless power is provided to wirelessly powered display 60, the wirelessly powered display 60 will display a still image that cannot be changed or re-programmed. When wireless power is not provided, no image is displayed. Alternatively, the display controller 46 can display a variable image, for example a blinking image, a series of stored independent still images, or a series of images representing a moving image or image sequence. Alternatively, the display controller 46 can receive wireless signals comprising an image or sequence of images and display the image or images.

In various embodiments, the wirelessly powered display 60 can have a single pixel with one light emitter 30 or multiple light emitters 30 emitting the same or different colors of light. Alternatively, the wirelessly powered display 60 has multiple pixels with one light emitter 30 or multiple light emitters 30 emitting the same or different colors of light.

In one configuration, the wirelessly powered display 60 is a sticker, includes a sticker, or has a substrate 62 that is a sticker. As intended herein, a sticker is an adhesive substrate 62 on which the wirelessly powered display 60 is provided, disposed, or formed. The substrate 62 can be rigid or flexible, and the adhesive can be permanent, temporary, or removable so that the wirelessly powered display 60 is permanently adhered to a surface, temporarily adhered to a surface, or removably adhered to a surface.

In an embodiment, wirelessly powered display 60 comprises an acoustic wave filter, a surface acoustic wave filter, or a bulk acoustic wave filter.

In an embodiment of the present invention, a wirelessly coupled display system 86 comprises a device (e.g., a mat 80 or a smart phone) including a wireless power transmitter (e.g., a portion of the mat circuit 84) that provides wireless power within a specified range (e.g., the wireless power transmitter is a near-field communication NFC device and provides a continuous or pulsed NFC signal). One or more wirelessly powered displays 60 are located within the range and are responsive to the wireless power provided by the device to display an image. In various embodiments, the device is a portable device, the device is a mobile device, the display is in a fixed location, or the display is mobile or affixed to a mobile or portable device.

In one embodiment, the wirelessly powered display 60 is mounted on the device. For example, the device can include a primary device display and the wirelessly powered display 60 is a secondary display mounted on or incorporated into the device. In another embodiment, the one or more wirelessly powered displays 60 are physically separate from the device. The device can be a mobile telephone or a smart phone and can be moved from a remote location outside the range to a location within the range to provide wireless power to the wirelessly powered display 60 and cause the wirelessly powered display 60 to display an image.

The device can include a stored image and an image transmitter circuit (e.g., a portion of the mat circuit 84) that wirelessly provides the stored image to the wirelessly powered display 60 and the wirelessly powered display 60 is responsive to the wirelessly provided image to display the image. To facilitate the process, the electronic circuit 40 of the wirelessly powered display 60 can include a display controller 46 (FIG. 2).

In an embodiment of the present invention, a wirelessly coupled display system 86 includes one wirelessly powered display 60 or a plurality of wirelessly powered displays 60. Each wirelessly powered display 60 can have an identification and a circuit (e.g., a portion of the electronic circuit 40) for responding to the identification when the identification is transmitted. The device can include a transmitter circuit (e.g., a portion of the mat circuit 84) that wirelessly provides one or more of the identifications to the one or more wirelessly powered displays 60.

Embodiments of the present invention enable a variety of low-cost wirelessly powered displays 60 that are inactive until a device, such as a smart phone, come into range and provide wireless power to activate the wirelessly powered display 60 to provide information, for example information local or contextual to the wirelessly powered display 60. Since the wirelessly powered displays 60 do not have an independent external power source they can be located in a wide variety of places not associated with powered devices (e.g., remote from an electrical power transmission grid) and since the wirelessly powered displays 60 do not have an internal power source (e.g., a battery) they can have a very long lifetime.

U.S. patent application Ser. No. 14/743,981, filed Jun. 18, 2015, entitled Micro Assembled Micro LED Displays and Lighting Elements, incorporated herein by reference describes micro-transfer printing structures and processes useful with the present invention. For a discussion of micro-transfer printing techniques see also U.S. Pat. Nos. 8,722, 458, 7,622,367 and 8,506,867, each of which is hereby incorporated by reference in its entirety. Micro-transfer printing using compound micro assembly structures and methods can also be used with the present invention, for example, as described in U.S. patent application Ser. No. 14/822,868, filed Aug. 10, 2015, entitled Compound Micro-Assembly Strategies and Devices, which is hereby incorporated by reference in its entirety.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

10 hybrid banknote/hybrid high-security document
20 banknote/document/high-security document
22 visible markings
30 light emitter
32 inorganic light-emitting diode
34 tether
36 iLED source wafer
40 electronic circuit
44 memory
46 display controller
50 antenna
51 antenna layer
52 power converter/acoustic wave filter
54 dielectric layer
60 light-emitting module/wirelessly powered display
62 substrate
64 wires
66 ASIC
70 ribbon
80 mat
82 display
84 mat circuit
86 wirelessly coupled display system
100 provide banknote with markings step
110 provide module wafer step
120 micro-transfer print modules on banknote step
130 provide ribbon step
140 micro-transfer print modules on ribbon step
150 integrate ribbon in banknote step
200 provide hybrid banknote step
210 expose hybrid banknote to NFC field step
215 expose hybrid banknote to NFC field from mat step
217 read information from banknote step
220 observe/detect emitted light step
225 observe display step
230 transfer information to computer system step
300 provide iLED source wafer step
310 provide SAW source wafer step
320 provide ASIC source wafer step
330 micro-transfer print iLED to intermediate substrate step
340 micro-transfer print SAW to intermediate substrate step
350 micro-transfer print ASIC to intermediate substrate step
360 form interconnections and antennas step
370 micro-transfer print modules to ribbon step
380 integrate ribbons into banknote step

What is claimed is:
1. A wirelessly powered display, comprising:
a substrate;
an antenna with multiple turns disposed on the substrate;
an electronic circuit disposed on the substrate; and one or more pixels each having one or more inorganic light-emitting diodes disposed on the substrate; wherein:
the electronic circuit is electrically connected to the one or more inorganic LEDs and the antenna;
the antenna is responsive to electromagnetic energy from a device comprising a wireless power transmitter within a specified range to provide electrical power to the wirelessly powered display; and
the electronic circuit comprises a power converter that converts a signal with a relatively high current and low voltage to a signal with a relatively high voltage and low current.

2. The wirelessly powered display of claim 1, wherein the display has multiple pixels.

3. The wirelessly powered display of claim 1, wherein the display is a sticker.

4. The wirelessly powered display of claim 1, wherein the display has a fixed image.

5. The wirelessly powered display of claim 1, wherein the display comprises an acoustic wave filter, a surface acoustic wave filter, or a bulk acoustic wave filter.

6. The wirelessly powered display of claim 1, wherein the display excludes a battery, internal power source, or wired power source and the display operates solely on the electrical power provided through the antenna.

7. The wirelessly powered display of claim 1, wherein the display has a single pixel.

8. A wirelessly coupled display system, comprising:
a device comprising a wireless power transmitter that provides wireless power within a specified range; and
one or more wirelessly powered displays located within the specified range and responsive to the wireless power provided by the device to display an image, wherein each wirelessly powered display comprises:
a substrate;
an antenna with multiple turns disposed on the substrate;
an electronic circuit disposed on the substrate; and
one or more pixels each having one or more inorganic light-emitting diodes disposed on the substrate; wherein:
the electronic circuit is electrically connected to the one or more inorganic LEDs and the antenna;
the antenna is responsive to electromagnetic energy from the device to provide electrical power; and
the electronic circuit comprises a power converter that converts a signal with a relatively high current and low voltage to a signal with a relatively high voltage and low current.

9. The wirelessly coupled display system of claim 8, wherein the device is a portable device or a mobile device, the display is in a fixed location, or the display is mobile or affixed to a mobile device or portable device.

10. The wirelessly powered display of claim 8, wherein the display is mounted on the device.

11. The wirelessly powered display of claim 8, wherein the one or more displays are physically separate from the device.

12. The wirelessly coupled display system of claim 8, wherein the wireless power transmitter is a near-field communication device.

13. The wirelessly coupled display system of claim 8, wherein the device is a mobile telephone or a smart phone.

14. The wirelessly coupled display system of claim 8, wherein:
the device comprises a stored image and an image transmitter circuit that wirelessly provides the stored image to the display; and
the display is responsive to the wirelessly provided image to display the image.

15. The wirelessly coupled display system of claim 8, wherein the display comprises a display controller.

16. The wirelessly coupled display system of claim 8, wherein the device comprises a primary device display and the display is a secondary display mounted on or incorporated into the device.

17. The wirelessly coupled display system of claim 8, wherein:
each display has an identification and a circuit for responding to the identification when the identification is transmitted; and
the device comprises a transmitter circuit that wirelessly provides one or more of the identifications to the one or more displays.

18. A wirelessly powered display, comprising:
a substrate; and
a plurality of light-emitting modules disposed on the substrate, each light-emitting module having an antenna with multiple turns disposed on the substrate, an electronic circuit disposed on the substrate, and one or more pixels each having one or more inorganic light-emitting diodes disposed on the substrate; wherein, for each light-emitting module, the electronic circuit is electrically connected to the one or more inorganic LEDs and the antenna, the antenna is responsive to electromagnetic energy from a device comprising a wireless power transmitter within a specified range to provide electrical power to the wirelessly powered display, and the electronic circuit comprises a power converter that converts a signal with a relatively high current and low voltage to a signal with a relatively high voltage and low current.

19. A wirelessly coupled display system, comprising:
a device comprising a wireless power transmitter that provides wireless power within a specified range; and
a wirelessly powered display located within the specified range and responsive to the wireless power provided by the device to display an image, wherein the wirelessly powered display comprises:
a substrate; and
a plurality of light-emitting modules disposed on the substrate, each light-emitting module having an antenna with multiple turns disposed on the substrate, an electronic circuit disposed on the substrate, and one or more pixels each having one or more inorganic light-emitting diodes disposed on the substrate; wherein, for each light-emitting module, the electronic circuit is electrically connected to the one or more inorganic LEDs and the antenna, the antenna is responsive to electromagnetic energy from the device to provide electrical power, and the electronic circuit comprises a power converter that converts a signal with a relatively high current and low voltage to a signal with a relatively high voltage and low current.

* * * * *